(12) United States Patent
Kurokawa

(10) Patent No.: US 9,064,596 B2
(45) Date of Patent: Jun. 23, 2015

(54) SEMICONDUCTOR DEVICE

(71) Applicant: Semiconductor Energy Laboratory Co., Ltd., Kanagawa-ken (JP)

(72) Inventor: Yoshiyuki Kurokawa, Sagamihara Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/177,501

(22) Filed: Feb. 11, 2014

(65) Prior Publication Data

US 2014/0226781 A1    Aug. 14, 2014

(30) Foreign Application Priority Data

Feb. 12, 2013  (JP) .................. 2013-024732

(51) Int. Cl.
  *G11C 19/28*   (2006.01)
  *G11C 11/24*   (2006.01)
  *G11C 29/32*   (2006.01)

(52) U.S. Cl.
  CPC ............... *G11C 19/28* (2013.01); *G11C 11/24* (2013.01); *G11C 29/32* (2013.01)

(58) Field of Classification Search
  CPC .. G11C 11/24; G11C 11/404; G11C 11/4045; G11C 11/4072
  USPC .......................................................... 377/64
  See application file for complete search history.

(56) References Cited

U.S. PATENT DOCUMENTS

| | | | |
|---|---|---|---|
| 3,775,693 A | 11/1973 | Proebsting | |
| 4,754,432 A * | 6/1988 | Topich | ..................... 365/185.08 |
| 4,797,576 A | 1/1989 | Asazawa | |
| 4,800,303 A | 1/1989 | Graham et al. | |
| 4,809,225 A | 2/1989 | Dimmler et al. | |
| 5,039,883 A | 8/1991 | On | |
| 5,097,449 A * | 3/1992 | Cuevas | ..................... 365/185.07 |

(Continued)

FOREIGN PATENT DOCUMENTS

| | | | |
|---|---|---|---|
| EP | 1737044 A | 12/2006 | |
| EP | 2226847 A | 9/2010 | |

(Continued)

OTHER PUBLICATIONS

Jeon, S. et al., "180nm Gate Length Amorphous InGaZnO Thin Film Transistor for High Density Image Sensor Applications," IEDM 10: Technical Digest of International Electron Devices Meeting, Dec. 6, 2010, pp. 504-507.

(Continued)

*Primary Examiner* — Thomas J Hiltunen
(74) *Attorney, Agent, or Firm* — Husch Blackwell LLP

(57) ABSTRACT

A register for a scan test has a data saving function. A scan flipflop includes first to third memory circuits. The first memory circuit is a memory circuit functioning as a register of a combination circuit in normal operation. The second memory circuit is a memory circuit for backup of the first memory circuit. The third memory circuit has a function of transferring data to a flipflop in a next stage. Further, the second memory circuit has a function of writing data of the first memory circuit to the third memory circuit and a function of writing data of the third memory circuit to the first memory circuit. At a given time, data of the first memory circuit can be extracted from an external device and data can be stored in the first memory circuit from an external device.

17 Claims, 13 Drawing Sheets

(56) References Cited

U.S. PATENT DOCUMENTS

| | | | |
|---|---|---|---|
| 5,473,571 A | 12/1995 | Shigematsu et al. | |
| 5,731,856 A | 3/1998 | Kim et al. | |
| 5,744,864 A | 4/1998 | Cillessen et al. | |
| 5,894,433 A * | 4/1999 | Itoh et al. | 365/154 |
| 5,912,937 A * | 6/1999 | Goetting et al. | 377/67 |
| 5,936,879 A | 8/1999 | Brouwer et al. | |
| 5,980,092 A | 11/1999 | Merryman et al. | |
| 6,018,559 A * | 1/2000 | Azegami et al. | 377/79 |
| 6,049,883 A | 4/2000 | Tjandrasuwita | |
| 6,078,194 A | 6/2000 | Lee | |
| 6,204,695 B1 | 3/2001 | Alfke et al. | |
| 6,281,710 B1 | 8/2001 | Poirier et al. | |
| 6,294,274 B1 | 9/2001 | Kawazoe et al. | |
| 6,556,475 B2 | 4/2003 | Yamazaki et al. | |
| 6,563,174 B2 | 5/2003 | Kawasaki et al. | |
| 6,573,754 B2 | 6/2003 | Menczigar et al. | |
| 6,674,665 B1 * | 1/2004 | Mann et al. | 365/185.08 |
| 6,693,616 B2 | 2/2004 | Koyama et al. | |
| 6,727,522 B1 | 4/2004 | Kawasaki et al. | |
| 6,738,281 B2 | 5/2004 | Yokozeki | |
| 6,788,567 B2 | 9/2004 | Fujimori | |
| 6,909,411 B1 | 6/2005 | Yamazaki et al. | |
| 6,975,298 B2 | 12/2005 | Koyama et al. | |
| 7,019,999 B1 | 3/2006 | Srinivasan et al. | |
| 7,031,189 B2 | 4/2006 | Pascucci | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,076,748 B2 | 7/2006 | Kapoor et al. | |
| 7,105,868 B2 | 9/2006 | Nause et al. | |
| 7,151,511 B2 | 12/2006 | Koyama | |
| 7,158,157 B2 | 1/2007 | Yamazaki et al. | |
| 7,211,825 B2 | 5/2007 | Shih et al | |
| 7,224,339 B2 | 5/2007 | Koyama et al. | |
| 7,269,780 B2 | 9/2007 | Arima et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,471,580 B2 | 12/2008 | Henzler et al. | |
| 7,501,293 B2 | 3/2009 | Ito et al. | |
| 7,557,801 B2 | 7/2009 | Ozaki | |
| 7,576,582 B2 | 8/2009 | Lee et al. | |
| 7,674,650 B2 | 3/2010 | Akimoto et al. | |
| 7,688,646 B2 * | 3/2010 | Kang et al. | 365/189.05 |
| 7,696,952 B2 | 4/2010 | Kimura et al. | |
| 7,732,819 B2 | 6/2010 | Akimoto et al. | |
| 7,863,627 B2 | 1/2011 | Honda | |
| 7,910,490 B2 | 3/2011 | Akimoto et al. | |
| 7,932,521 B2 | 4/2011 | Akimoto et al. | |
| 8,212,248 B2 | 7/2012 | Itagaki et al. | |
| 8,274,077 B2 | 9/2012 | Akimoto et al. | |
| 8,314,637 B2 | 11/2012 | Kato et al. | |
| 8,362,538 B2 | 1/2013 | Koyama et al. | |
| 8,368,066 B2 | 2/2013 | Yamazaki et al. | |
| 8,410,838 B2 | 4/2013 | Kato et al. | |
| 8,432,187 B2 | 4/2013 | Kato et al. | |
| 8,446,171 B2 | 5/2013 | Takahashi | |
| 8,488,394 B2 | 7/2013 | Nagatsuka et al. | |
| 8,508,256 B2 | 8/2013 | Yakubo et al. | |
| 8,575,985 B2 | 11/2013 | Ohmaru et al. | |
| 8,605,490 B2 | 12/2013 | Fackenthal | |
| 8,619,464 B1 | 12/2013 | Sinha et al. | |
| 8,630,130 B2 | 1/2014 | Kurokawa | |
| 8,638,594 B1 | 1/2014 | Sinha et al. | |
| 8,686,774 B2 * | 4/2014 | Kimura et al. | 327/199 |
| 8,792,275 B2 * | 7/2014 | Shih et al. | 365/185.07 |
| 8,817,536 B2 | 8/2014 | Scade et al. | |
| 2001/0046027 A1 | 11/2001 | Tai et al. | |
| 2002/0036529 A1 | 3/2002 | Furusawa et al. | |
| 2002/0056838 A1 | 5/2002 | Ogawa | |
| 2002/0074568 A1 | 6/2002 | Yoshida et al. | |
| 2002/0132454 A1 | 9/2002 | Ohtsu et al. | |
| 2003/0076282 A1 | 4/2003 | Ikeda et al. | |
| 2003/0122581 A1 | 7/2003 | Inoue et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2004/0196082 A1 * | 10/2004 | Pacha et al. | 327/215 |
| 2004/0196689 A1 * | 10/2004 | Ohtsuka et al. | 365/154 |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0038582 A1 | 2/2006 | Peeters | |
| 2006/0043377 A1 | 3/2006 | Hoffman et al. | |
| 2006/0091793 A1 | 5/2006 | Baude et al. | |
| 2006/0095975 A1 | 5/2006 | Yamada et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0119394 A1 | 6/2006 | Dronavalli | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0002619 A1 * | 1/2007 | Schoenauer et al. | 365/185.08 |
| 2007/0019460 A1 | 1/2007 | Kang et al. | |
| 2007/0024187 A1 | 2/2007 | Shin et al. | |
| 2007/0024318 A1 | 2/2007 | Mamidipaka | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0126666 A1 | 6/2007 | Yamazaki et al. | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0048744 A1 | 2/2008 | Fukuoka | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0170028 A1 | 7/2008 | Yoshida | |
| 2008/0182358 A1 | 7/2008 | Cowdery-Corvan et al. | |
| 2008/0197414 A1 | 8/2008 | Hoffman et al. | |
| 2008/0224133 A1 | 9/2008 | Park et al. | |
| 2008/0253500 A1 * | 10/2008 | Tso et al. | 377/69 |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |

(56) References Cited

U.S. PATENT DOCUMENTS

| | | | |
|---|---|---|---|
| 2008/0308805 | A1 | 12/2008 | Akimoto et al. |
| 2009/0002044 | A1 | 1/2009 | Kobayashi |
| 2009/0008639 | A1 | 1/2009 | Akimoto et al. |
| 2009/0045397 | A1 | 2/2009 | Iwasaki |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2009/0305461 | A1 | 12/2009 | Akimoto et al. |
| 2010/0019839 | A1 | 1/2010 | Monden |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0136743 | A1 | 6/2010 | Akimoto et al. |
| 2011/0102018 | A1 | 5/2011 | Shionoiri et al. |
| 2011/0104851 | A1 | 5/2011 | Akimoto et al. |
| 2011/0117697 | A1 | 5/2011 | Akimoto et al. |
| 2011/0121290 | A1 | 5/2011 | Akimoto et al. |
| 2011/0121878 | A1 | 5/2011 | Kato et al. |
| 2011/0148463 | A1 | 6/2011 | Kato et al. |
| 2011/0156024 | A1 | 6/2011 | Koyama et al. |
| 2011/0163311 | A1 | 7/2011 | Akimoto et al. |
| 2011/0176357 | A1 | 7/2011 | Koyama et al. |
| 2011/0187410 | A1 | 8/2011 | Kato et al. |
| 2011/0249487 | A1 | 10/2011 | Saito et al. |
| 2011/0273925 | A1* | 11/2011 | Yamamoto et al. ........... 365/154 |
| 2011/0298517 | A1* | 12/2011 | Pal ................. 327/202 |
| 2012/0033510 | A1 | 2/2012 | Nagatsuka et al. |
| 2012/0250397 | A1 | 10/2012 | Ohmaru |
| 2012/0250407 | A1 | 10/2012 | Kurokawa |
| 2012/0269013 | A1 | 10/2012 | Matsuzaki |
| 2012/0287099 | A1 | 11/2012 | Toyotaka |
| 2012/0320663 | A1* | 12/2012 | Kimura et al. ................. 365/149 |
| 2013/0057315 | A1 | 3/2013 | Kato et al. |
| 2013/0069964 | A1* | 3/2013 | Wuu et al. ..................... 345/530 |
| 2013/0127497 | A1 | 5/2013 | Koyama |
| 2013/0135943 | A1 | 5/2013 | Ohmaru |
| 2013/0222033 | A1 | 8/2013 | Kato et al. |
| 2013/0286721 | A1* | 10/2013 | Jung et al. ..................... 365/158 |
| 2014/0126271 | A1 | 5/2014 | Aoki et al. |
| 2014/0266367 | A1 | 9/2014 | Uesugi |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-110392 A | 4/1993 |
| JP | 05-251705 A | 9/1993 |
| JP | 06-295597 A | 10/1994 |
| JP | 08-264794 A | 10/1996 |
| JP | 10-078836 A | 3/1998 |
| JP | 11-505377 | 5/1999 |
| JP | 2000-044236 A | 2/2000 |
| JP | 2000-077982 A | 3/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-050208 A | 2/2006 |
| WO | WO-2004/114391 | 12/2004 |

OTHER PUBLICATIONS

Song, I. et al., "Short Channel Characteristics of Gallium—Indium—Zinc—Oxide Thin Film Transistors for Three-Dimensional Stacking Memory," IEEE Electron Device Letters, Jun. 1, 2008, vol. 29, No. 6, pp. 549-552.

Yamazaki, S. et al., "Research, Development, and Application of Crystalline Oxide Semiconductor," SID Digest '12: SID International Symposium Digest of Technical Papers, Jun. 5, 2012, pp. 183-186.

Nishijima, T. et al., "Low-power Display System Driven by Utilizing Technique Using Crystalline IGZO Transistor,", SID Digest '12 SID International Symposium Digest of Technical Papers, 2012, pp. 583-586.

Shukuri, S. et al., "A Complementary Gain Cell Technology for sub-1 V Supply DRAMs," IEDM 92: Technical Digest of International Electron Devices Meeting, Dec. 13, 1992, pp. 1006-1008.

Shukuri, S. et al., "A Semi-Static Complementary Gain Cell Technology for Sub-1 V Supply DRAM's," IEEE Transactions on Electron Devices, Jun. 1, 1994, vol. 41, No. 6, pp. 926-931.

Kim, W. et al., "An Experimental High-Density DRAM Cell with a Built-in Gain Stage," IEEE Journal of Solid-State Circuits, Aug. 1, 1994, vol. 29, No. 8, pp. 978-981.

Chun, K.C. et al., "A 3T Gain Cell Embedded DRAM Utilizing Preferential Boosting for High Density and Low Power On-Die Caches," IEEE Journal of Solid-State Circuits, Jun. 1, 2011, vol. 46, No. 6, pp. 1495-1505.

Naito, T. et al., "World's First Monolithic 3D-FPGA with TFT SRAM over 90nm 9 layer Cu CMOS," 2010 Symposium on VLSI Technology: Digest of Technical Papers, Jun. 15, 2010, pp. 219-220.

Ishii, T. et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amprphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

(56) References Cited

OTHER PUBLICATIONS

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using a single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—-Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn—Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YeFe2O4, and Yb2Fe3O7 Types of Structures for Compounds in the In2O3 and Sc2O3-A2O3-BO Systems

(56) References Cited

OTHER PUBLICATIONS

[A; Fe, Ga, or Al; B: Mg, Mm, Fe, Ni, Cu,or Zn] at Tempatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistors on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

SEMICONDUCTOR DEVICE

BACKGROUND OF THE INVENTION

1. Field of the Invention

The present invention relates to an object, a method, or a manufacturing method. Further, the present invention relates to a process, a machine, manufacture, or a composition of matter. For example, in this specification, a semiconductor device, a display device, and a power storage device, driving methods of thereof, and manufacturing methods thereof are described. In this specification, as the semiconductor device, for example, a memory circuit, a processor including a memory circuit (typically, a programmable logic device, a CPU, or a microcontroller), an electronic device including the processor, and the like are described.

Note that in this specification, a semiconductor device means a device that includes a circuit including a semiconductor element (e.g., a transistor or a diode). Alternatively, the semiconductor device means any device that can function by utilizing semiconductor characteristics. For example, an integrated circuit, a chip including an integrated circuit, a display device, a light-emitting device, an electronic device, and the like are included in a semiconductor device or include a semiconductor device in some cases.

A programmable logic device (PLD) is one kind of integrated circuit, and is an integrated circuit whose internal circuit structure can be changed by a user with programming after shipment. Note that examples of user-programmable devices are small-scale integrated circuits such as a programmable array logic (PAL) and a generic array logic (GAL) and large-scale integrated circuits such as a complex programmable logic device (CPLD) and a field programmable gate array (FPGA). In this specification, programmable integrated circuits (including the above integrated circuits) are called PLDs.

Note that the term "microcontroller" means one kind of integrated circuit and is referred to as "microcontroller unit", "microprocessor unit", "MCU", "μC", and the like.

2. Description of the Related Art

One of operation testing methods of an integrated circuit is a scan test.

This is a test in which flipflops (hereinafter, also referred to as FFs) in an integrated circuit are regarded as one shift register and data stored in the FFs are sequentially obtained from an external terminal of the integrated circuit or sequentially stored to the FFs from an external terminal of the integrated circuit independently of normal circuit operation. Since the FFs are used as a register of a combination circuit, not only data stored in the FFs but also operation of a logic circuit (combination circuit) utilizing data of the FFs can be verified through a scan test.

A shift register of a scan test circuit is referred to as a scan chain in some cases. Further, a FF included in a scan chain (shift register) is referred to as a scan flipflop in some cases.

For reduced power consumption of an integrated circuit, power supply to a circuit unnecessary for operation is stopped. However, a flipflop included in a register is a volatile memory circuit generally. When data of a register is lost owing to power supply stop, continuous processing is difficult to perform in an integrated circuit even after the power supply is restarted. Therefore, saving data of a register to a nonvolatile memory before the power supply stop is proposed. For example, in Patent Document 1, saving data stored in a scan FF to a ferroelectric memory utilizing a shift register for a scan test is disclosed.

REFERENCE

Patent Document

[Patent Document 1] Japanese Published Patent Application No. H10-078836

SUMMARY OF THE INVENTION

Although a scan test is effective for failure analysis of an integrated circuit and the like, a scan FF is necessarily provided in the integrated circuit instead of a normal FF. Therefore, a circuit including a part which is not related to normal operation at all is provided in the integrated circuit. The scan test has an advantage, whereas it is known to have adverse effects such as an increase in manufacturing cost owing to an increase in chip area and a decrease in operation characteristics owing to wiring delay.

Further, as in Patent Document 1, a nonvolatile memory is provided to save data of a scan FF, resulting in an increased chip area.

In view of the above, an object of one embodiment of the present invention is to provide a semiconductor device or the like which includes a novel shift register for a scan test. An object of one embodiment of the present invention is to provide a semiconductor device or the like which includes a shift register for a scan test while an increase in chip area is suppressed. An object of one embodiment of the present invention is to provide a semiconductor device or the like which can save data of a scan FF while an increase in chip area is suppressed. An object of one embodiment of the present invention is to provide a semiconductor device or the like with low power consumption. An object of one embodiment of the present invention is to provide a novel semiconductor device or the like.

Note that the descriptions of these objects do not disturb the existence of other objects. One embodiment of the present invention does not necessarily achieve all the objects. Other objects will be apparent from and can be derived from the description of the specification, the drawings, the claims, and the like.

One embodiment of the present invention is a semiconductor device that includes a register including a plurality of flipflops. Each flipflop includes first to third memory circuits. The first memory circuit is a memory circuit functioning as a register of a combination circuit. The second memory circuit is a memory circuit for backup of the first memory circuit. The second memory circuit has a function of writing data of the first memory circuit to the third memory circuit and a function of writing data of the third memory circuit to the first memory circuit. The third memory circuit has a function of transferring the data to the third memory circuit of a flipflop in a next stage. Thus, the semiconductor device according to one embodiment of the present invention can extract data of the first memory circuit at a given time and store data to the first memory circuit from an external device.

In the above embodiment, the second memory circuit can include a transistor whose channel is formed using an oxide semiconductor. Further, the third memory circuit can include a transistor whose channel is formed using an oxide semiconductor.

In this specification, a transistor whose channel is formed using an oxide semiconductor is referred to as an oxide semiconductor transistor or an OS transistor in some cases.

According to one embodiment of the present invention, a plurality of flipflops functioning as a register can form a shift register for a scan test. According to one embodiment of the present invention, a semiconductor device with low power consumption can be provided. According to one embodiment of the present invention, a semiconductor device with improved reliability can be provided. Alternatively, a semiconductor device capable of a scan test while an increase in chip area is suppressed can be provided.

DETAILED DESCRIPTION OF THE INVENTION

Figure 1:
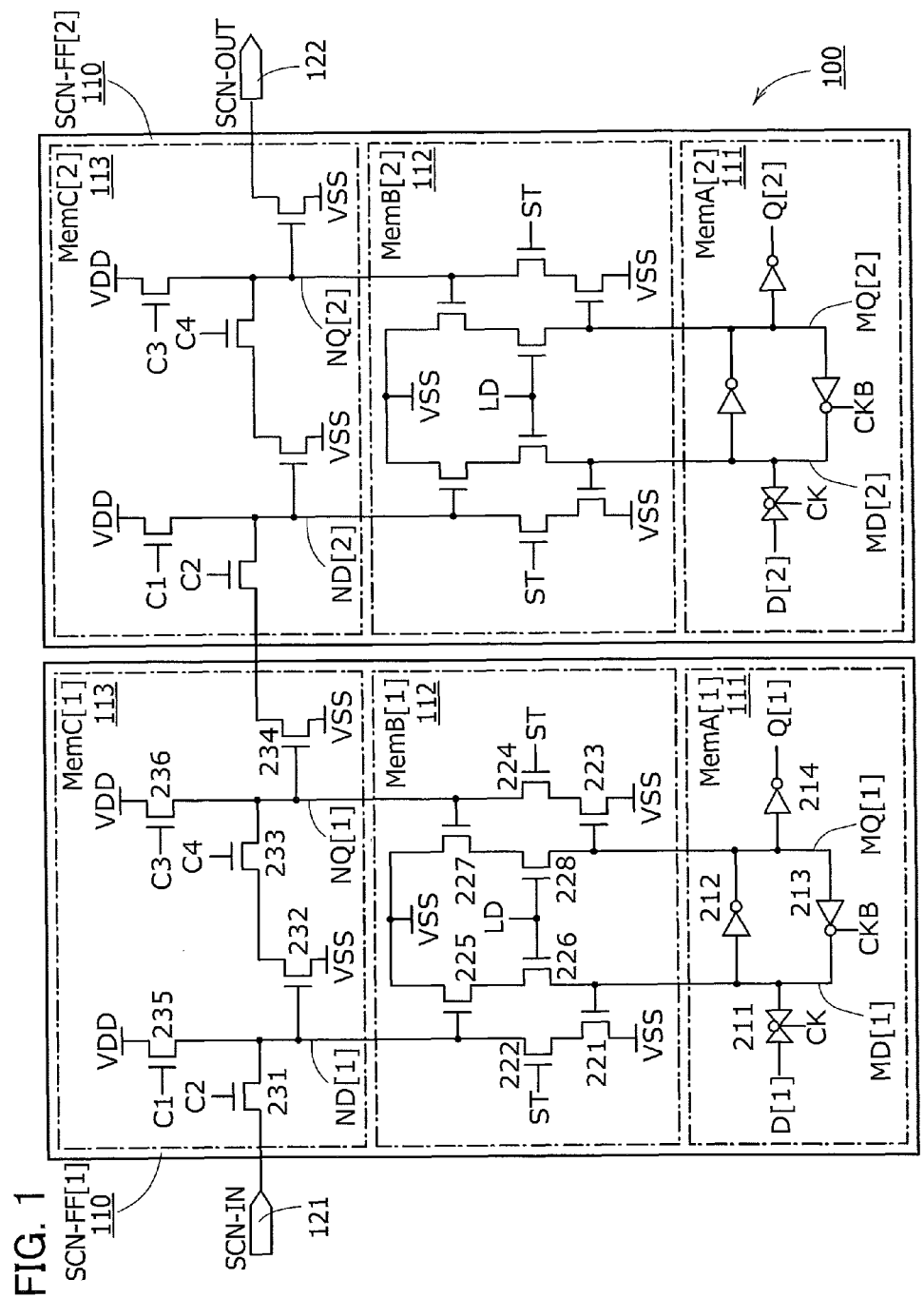
FIG. 1 is a circuit diagram showing a configuration example of a shift register for a scan test.

Hereinafter, embodiments of the present invention will be described in detail with reference to the accompanying drawings. Note that the present invention is not limited to the following description, and it will be easily understood by those skilled in the art that various changes and modifications can be made without departing from the spirit and scope of the present invention. Therefore, the present invention should not be construed as being limited to the following embodiments.

Note that in the drawings used for the description of the embodiments of the present invention, the same portions or portions having similar functions are denoted by the same reference numerals, and repeated description thereof is omitted in some cases.

Embodiment 1

In this embodiment, a shift register which can be used for a scan test is described as an example of a semiconductor device. This embodiment will be described below with reference to FIG. 1, FIGS. 2A and 2B, FIG. 3, FIG. 4, and FIG. 5.

The shift register of this embodiment can be incorporated in a variety of integrated circuits such as a PLD, a CPU, and an MPU as a memory circuit and a verification circuit for a scan test.

<Configuration Example of Shift Register>

Figure 2A:
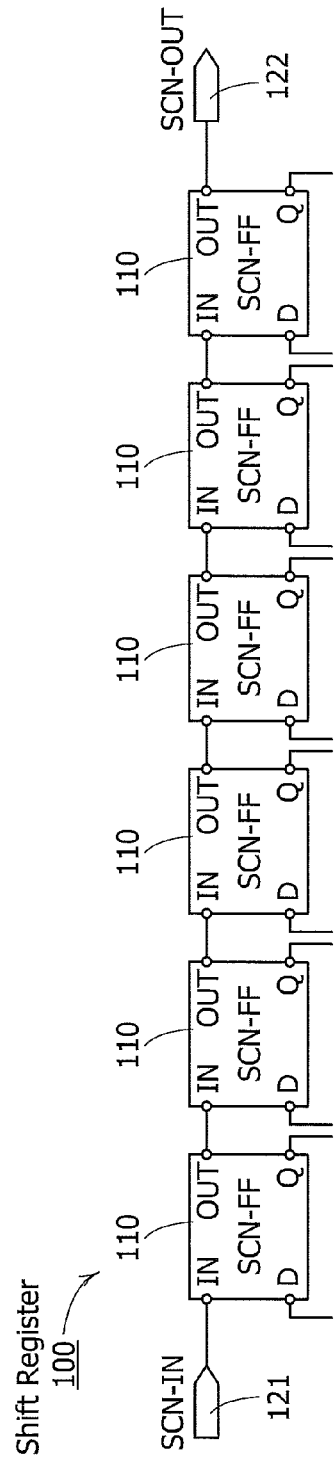
FIG. 2A is a block diagram showing a configuration example of a shift register for a scan test and FIG. 2B is a block diagram illustrating an example of a configuration of a scan flipflop.
Figure 2B:
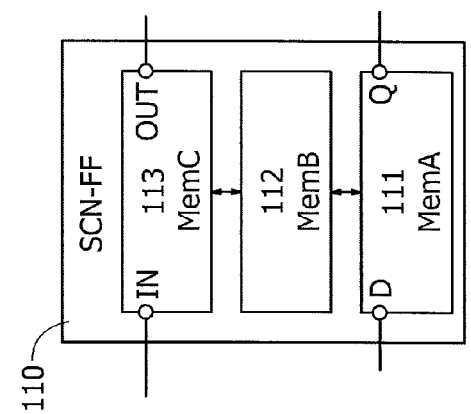
Figure 3:
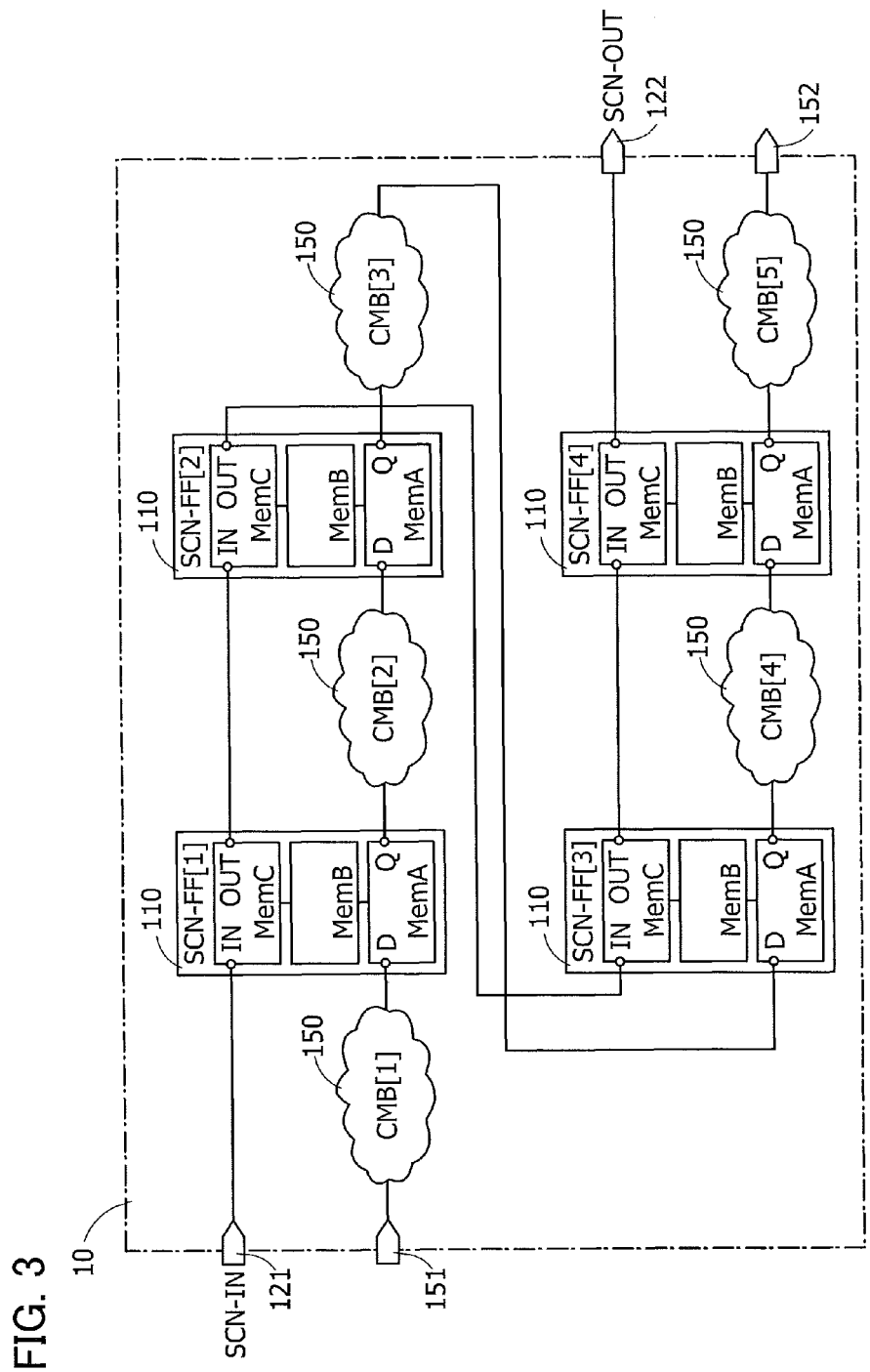
FIG. 3 is a block diagram illustrating a configuration example of an integrated circuit capable of a scan test.

FIG. 2A is a block diagram illustrating a configuration example of a shift register (scan chain) for a scan test. FIG. 2B is a block diagram illustrating a configuration example of a scan flipflop included in the shift register. Further, FIG. 3 is a block diagram of an integrated circuit including the shift register in FIG. 2A.

A shift register 100 in FIG. 2A includes a plurality of scan flipflops 110 connected in a cascade. As shown in FIG. 2A, output terminals OUT of the scan flipflops 110 are connected to input terminals IN of the scan flipflops 110 in the respective next stages.

The shift register 100 can be incorporated in a variety of integrated circuits including a logic circuit such as a processor. An input terminal 121 (SCN-IN) is a data input terminal for a scan test, and an output terminal 122 (SCN-OUT) is a data output terminal. Data input from the input terminal 121 can be written to a given scan flipflop 110. Data stored in the scan flipflops 110 can be transmitted to the scan flipflops 110 in the respective next stages by shift operation of the shift register 100 and extracted from the output terminal 122.

Further, when the integrated circuit normally operates, the scan flipflop 110 functions as a data memory portion, i.e., a so-called register, of a combination circuit. Output of the combination circuit is input from a terminal D and is held in the scan flipflop 110. The data held in the scan flipflop 110 is output to the combination circuit from a terminal Q.

<Structure Example of Scan FF; SCN-FF>

As shown in FIG. 2B, the scan flipflop 110 (SCN-FF) includes three memory circuits 111 to 113.

A memory circuit 111 (MemA) is a data memory portion of the combination circuit and functions as a so-called register. When the integrated circuit normally operates, data is input to the terminal D from the combination circuit and is stored in the memory circuit 111. The stored data is output to the combination circuit from the terminal Q.

The memory circuit 112 (MemB) is a memory circuit for backup of the memory circuit 111. In accordance with a control signal, the data of the memory circuit 111 is written to the memory circuit 112 to be stored. Further, the data stored in the memory circuit 112 is written back to the memory circuit 111. The memory circuit 112 can hold a potential corresponding to the data even in a period during which supply of a power supply potential to the scan flipflop 110 is stopped, and functions as a so-called nonvolatile memory.

A memory portion for backup of a register provided as described above enables power supply to the semiconductor device to be stopped as appropriate, resulting in reduced power consumption of the semiconductor device.

The memory circuit 113 (MemC) has a function of storing data input from the terminal IN and a function of outputting the stored data from the terminal OUT. In other words, the memory circuit 113 has a function of transferring stored data to the memory circuit 113 of the scan flipflop 110 in a next stage. The plurality of scan flipflops 110 can function as a shift register.

The memory circuit 113 can hold a potential corresponding to the data even in a period during which supply of a power supply potential to the scan flipflop 110 is stopped in a way similar to that of the memory circuit 112, and functions as a so-called nonvolatile memory.

The memory circuit 112 further has a function of writing data stored in the memory circuit 111 to the memory circuit 113 and a function of writing data stored in the memory circuit 113 to the memory circuit 111. The functions of the memory circuit 112 and the memory circuit 113 enable writing data input from the input terminal 121 to the given memory circuit 111 of the shift register 100 and extracting the data stored in the given memory circuit 111 from the output terminal 122.

<Configuration Example of Integrated Circuit Capable of Scan Test>

FIG. 3 is a block diagram illustrating a configuration example of an integrated circuit including the shift register 100. FIG. 3 shows an example where a shift register including four scan flipflops 110 is provided in an integrated circuit 10. Further, in FIG. 3, as a configuration example of the integrated circuit 10, a combination circuit 150 (CMB) is connected between the two scan flipflops 110. Data to be processed in the integrated circuit 10 is input from an input terminal 151. Data processed in the integrated circuit 10 is output from an output terminal 152.

Note that number [1] and the like which are used in FIG. 3 are numbers for identifying circuits, signals, or the like having the same function and are used similarly in the other drawings in some cases.

In normal operation, the data input from the input terminal 151 is processed in a CMB[1]. The data output from the CMB[1] is stored in a MemA of a SCN-FF[1] and output to a CMB [2]. The data output from the CMB [2] is stored in a MemA of a SCN-FF[2] and output to a CMB[3]. Similar processes are performed also in CMBs[3] to [5] and SCN-FFs[3] and [4], and data output from the CMB[5] is eventually extracted from the output terminal 152 to the outside of the integrated circuit 10.

In the case where the SCN-FFs[1] to [4] function as a shift register, data stored in the MemC is output from the SCN-FF [1] and written to the MemC of the SCN-FF[2]. This operation is sequentially performed in the SCN-FFs[2] to [4], and eventually, data stored in the MemC of the SCN-FF[4] is output from the output terminal 122.

An example of a scan test is shown below. First, the integrated circuit 10 operates in a shift operation mode. The shift operation mode is a mode in which the SCN-FFs[1] to [4] operate as a shift register. Data for the test is input from the input terminal 121, and initial data for the test is stored in the SCN-FFs[1] to [4]. In the SCN-FFs[1] to [4], the initial data is written to the MemA from the MemC through the MemB.

Next, the integrated circuit 10 operates in a normal operation mode. The CMBs[1] to [5] operate using the initial data, and process results of the CMBs[1] to [4] are stored in the MemAs of the SCN-FFs[1] to [4]. Process results of the CMB[5] are output from the output terminal 152. Then, in the SCN-FFs[1] to [4], the MemB operates and the data stored in the MemA is written to the MemC. The shift operation mode is carried out again, and the data held in the SCN-FFs[1] to [4] is extracted from the output terminal 122 (SCN-OUT). Operation verification of the integrated circuit 10 can be performed in such a manner that a value of data output from the output terminal 122 is compared with a value output when there is no defect (expected value).

In the case where power supply to the CMBs[1] to [5] is stopped such as the case where the integrated circuit 10 is set to a power saving mode, data stored in the MemA is saved to the MemB in each of the SCN-FFs[1] to [4]. Further, in the case where power supply is restarted, in the SCN-FFs[1] to [4], the data stored in the MemB is written back to the MemA. Thus, the integrated circuit 10 can perform processing continuously from a state where the power supply is stopped.

When the data is written back to the MemA, the following can be performed: the integrated circuit 10 does not operate in a normal operation mode immediately, but the data saved to the MemB is verified first, and then, the integrated circuit 10 is returned to the normal operation mode.

In this case, power supply to the SCN-FFs[1] to [4] is restarted and power supply to the CMBs[1] to [5] is stopped. First, the SCN-FFs[1] to [4] operate in a shift operation mode. In the SCN-FFs[1] to [4], the data saved to the MemB is output from the output terminal 122 (SCN-OUT) through the MemC. By verifying the data output from the output terminal 122, error verification can be performed on the data saved to the SCN-FFs[1] to [4]. In the case where error is found from these error verification results, it is possible to perform an operation in which data for correcting the error is input from the input terminal 121 so that the data of the SCN-FFs[1] to [4] is rewritten.

<Example of Circuit Configuration of Shift Register>

Detailed structures and operation methods of the shift register 100 and the scan flipflop 110 are described using a circuit diagram in FIG. 1. The shift register 100 including the two scan flipflops 110 is illustrated in FIG. 1 for simple description.

[Structure Example of First Memory Circuit; MemA]

The memory circuit 111 (MemA) can be formed using a general flipflop. In FIG. 1, a loop circuit formed of an inverter 212 and a clocked inverter 213 is provided. The clocked inverter 213 is controlled in accordance with a clock signal CKB. An input node (node MD) of this loop circuit is connected to the terminal D through a switch 211, and an output node (node MQ) thereof is connected to the terminal Q through an inverter 214. The switch 211 is controlled in accordance with a clock signal CK. The clock signal CKB is an inverted signal of the clock signal CK.

Data writing and data reading of the memory circuit 111 are controlled in accordance with the clock signal CK and the clock signal CKB. When the potential of the clock signal CK is at a high level (H level), the switch 211 is turned on; thus, the clocked inverter 213 functions as an inverter. When the potential of the clock signal CK is at a low level (L level), the switch 211 is turned off; thus, output of the clocked inverter 213 is in a high impedance state.

Each of the nodes MD and MQ is a data holding portion of the memory circuit 111 and has a function of holding a potential corresponding to the data. The node MD has a function of holding a potential input from the terminal D. The node MQ has a function of holding a potential obtained by inverting the potential held in the node MD. The potential held in the node MQ is inverted by the inverter 214 and output from the terminal Q.

Hereinafter, the clock signal CK is referred to as a signal CK or a CK in some cases. Other signals and other potentials are sometimes abbreviated similarly.

[Structure Example of Second Memory Circuit; MemB]

The memory circuit 112 (MemB) includes eight transistors 221 to 228. Here, the transistors 221 to 228 are n-channel transistors. The memory circuit 112 is controlled in accordance with control signals (ST and LD) and has a function of writing data held in the nodes MD and MQ to the nodes ND and NQ and a function of writing data held in the nodes ND and NQ to the nodes MD and MQ. The memory circuit 112 saves data stored in the memory circuit 111 in accordance with a set signal ST and recovers data to the memory circuit 111 in accordance with a load signal LD.

The transistors 221 and 222 each function as a read circuit which reads data of the node MD to the node ND. Further, the transistors 223 and 224 each function as a read circuit which reads data of the node MQ to the node NQ. The transistors 221 and 222 which are connected in series connect a wiring for supplying a low power supply potential VSS and the node MD. A gate of the transistor 221 is connected to the node MD. The set signal ST is input to the gate of the transistor 221. Similarly, the transistors 223 and 224 which are connected in series connect a wiring for supplying VSS and the node MQ.

The memory circuit 112 saves data stored in the memory circuit 111 in accordance with the set signal ST. The signal ST is set to the H level, and in a period during which the transistors 222 and 224 are on, potentials corresponding to the data held in the nodes MD and MQ are supplied to the nodes ND and NQ. The signal ST is set to the L level and the transistors 222 and 224 are turned off, whereby the potentials (data) are held in the nodes ND and NQ.

The transistors 225 and 226 each function as a read circuit which reads data of the node ND to the node MD. Further, the transistors 227 and 228 each function as a read circuit which reads data of the node NQ to the node MQ. The transistors 225 and 226 which are connected in series connect the wiring for supplying VSS and the node MD. A gate of the transistor 225 is connected to the node ND. The load signal LD is input to a gate of the transistor 226. Similarly, the transistors 227 and 228 which are connected in series connect the wiring for supplying VSS and the node MQ.

The memory circuit 112 restores the data to the memory circuit 111 in accordance with the load signal LD. The signal LD is set to the H level, and in a period during which the transistors 226 and 228 are on, potentials corresponding to the data held in the nodes ND and NQ are supplied to the nodes MD and MQ. The signal LD is set to the L level and the transistors 226 and 228 are turned off, whereby the potentials (data) are held in the nodes MD and MQ.

In the configuration example in FIG. 1, the memory circuits 112 and 113 use the same nodes (ND and NQ) as data holding portions. In order to improve charge retention characteristics of the nodes ND and NQ, one or both thereof can be connected to capacitors.

Since the scan flipflop 110 includes nonvolatile data holding portions (nodes ND and NQ) as described above, operation of the memory circuit 112 controlled in accordance with the signals ST and LD is saving operation and recovery operation in the memory circuit 111 and can be referred to as data set operation and data load operation in the memory circuit 113. Since the operation of the memory circuit 112 controlled in accordance with the signal ST is also operation in which data is written from the memory circuit 111 to the memory circuit 113, the operation controlled in accordance with the signal ST can be referred to as operation in which data stored in the memory circuit 111 is stored in the memory circuit 113 (data set operation). Further, operation of the memory circuit 112 controlled in accordance with the signal LD can be referred to as operation in which data stored in the memory circuit 113 is stored in the memory circuit 111 (data load operation).

[Structure Example of Third Memory Circuit; MemC]

The memory circuit 113 includes six transistors 231 to 236. Here, the transistors 231 to 236 are n-channel transistors. Further, the memory circuit 113 extracts data from the input terminal 121 or the memory circuit 113 in a previous stage in accordance with four clock signals C1 to C4 and outputs the stored data to the memory circuit 113 in a next stage.

The transistor 231 functions as a switch for controlling conduction and non-conduction between the input terminal (IN) of the memory circuit 113 and the node ND. The signal C2 is input to a gate of the transistor 231. When the transistor 231 is turned on, data is input to the memory circuit 113 from the input terminal (IN) and a potential corresponding to this data is stored in the node ND.

The transistors 232 and 233 each function as a read circuit that reads data held in the node ND to the node NQ. The transistors 232 and 233 which are connected in series connect a wiring to which the low power supply potential VSS is supplied and the node NQ. A gate of the transistor 232 is connected to the node ND. The signal C4 is input to a gate of the transistor 233. When the transistor 233 is turned on, a potential corresponding to the potential held in the node ND is written to the node NQ.

The transistor 234 functions as a read circuit that reads data held in the node NQ to the output terminal (OUT) of the memory circuit 113. A gate of the transistor 234 is connected to the node NQ. A source of the transistor 234 is connected to a wiring to which VSS is supplied and a drain thereof is connected to the output terminal (OUT).

Note that a transistor is an element having three terminals (electrodes): a gate, a source, and a drain. The functions of two terminals (the source and the drain (excluding the gate)) might interchange depending on the conductivity type (n-type or p-type) of the transistor and potentials input to the terminals. Thus, in the shift register 100, the relation of the source and the drain might be opposite. The same applies to other circuits. Therefore, in this specification, in some cases, the terminals (electrodes) excluding the gate of the transistor are not referred to as a source and a drain but as a first electrode and a second electrode.

The transistor 235 functions as a switch for controlling conduction and non-conduction between the node ND and a wiring to which the high power supply potential VDD is supplied. Further, the transistor 235 can be referred to as a precharge circuit that precharges the node ND. The signal C1 is input to a gate of the transistor 235. A source of the transistor 235 is connected to the node ND and a drain thereof is connected to the wiring to which VDD is supplied. By turning on the transistor 235, VDD is supplied to the node ND, so that the node ND becomes the H level.

The transistor 236 functions as a switch for controlling conduction and non-conduction between the node NQ and a wiring to which the high power supply potential VDD is supplied. Further, the transistor 236 can be referred to as a precharge circuit that precharges the node NQ. The signal C3 is input to a gate of the transistor 236. A source of the transistor 236 is connected to the node NQ, and a drain thereof is connected to the wiring to which VDD is supplied. By turning on the transistor 236, VDD is supplied to the node NQ, so that the node NQ becomes the H level.

The circuits (transistors 235 and 236) for precharging the nodes ND and NQ may be provided as needed.

Here, in order that the memory circuits 112 and 113 hold data for a long time after supply of VDD is stopped, variations in potentials (charges) held in the nodes ND and NQ which are electrically in a floating state are suppressed as much as possible. For that purpose, a leakage path of charges from the nodes ND and NQ is not formed as much as possible or charges flowing through this leakage path are reduced as much as possible.

Therefore, a transistor having a small leakage current in an off state (low off-state current) is preferably used as each of the transistors 221 to 224 and 231 to 236. Here, low off-state current means that normalized off-state current per micrometer of a channel width at room temperature is lower than or equal to 10 zA. Since the off-state current is preferably as low as possible, the normalized off-state current is preferably lower than or equal to 1 zA, more preferably lower than or equal to 10 yA, still more preferably lower than or equal to 1 yA. Note that voltage between a source and a drain in that case is, for example, in the range from 0.1 V to 3 V, or approximately 5 V. An example of a transistor having such low off-state current is a transistor whose channel is fainted in an oxide semiconductor.

In the memory circuit 112, at least one of the transistors 221 and 222 is a transistor with an extremely low off-state current. In addition, at least one of the transistors 223 and 224 is a transistor with an extremely low off-state current.

<Example of Operation Method of Shift Register>

Figure 4:
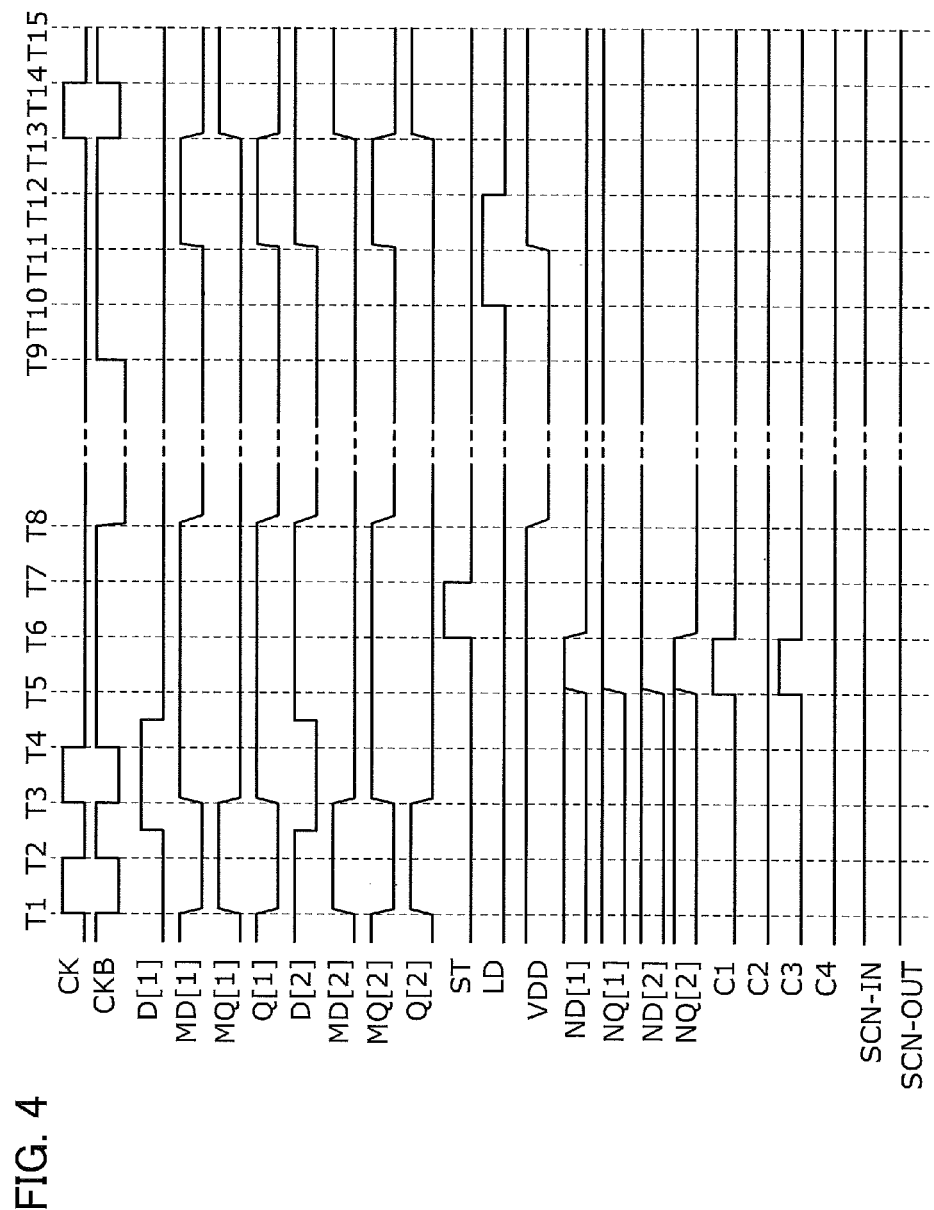
FIG. 4 is a timing chart showing an example of a method for driving the shift register in FIG. 1.
Figure 5:
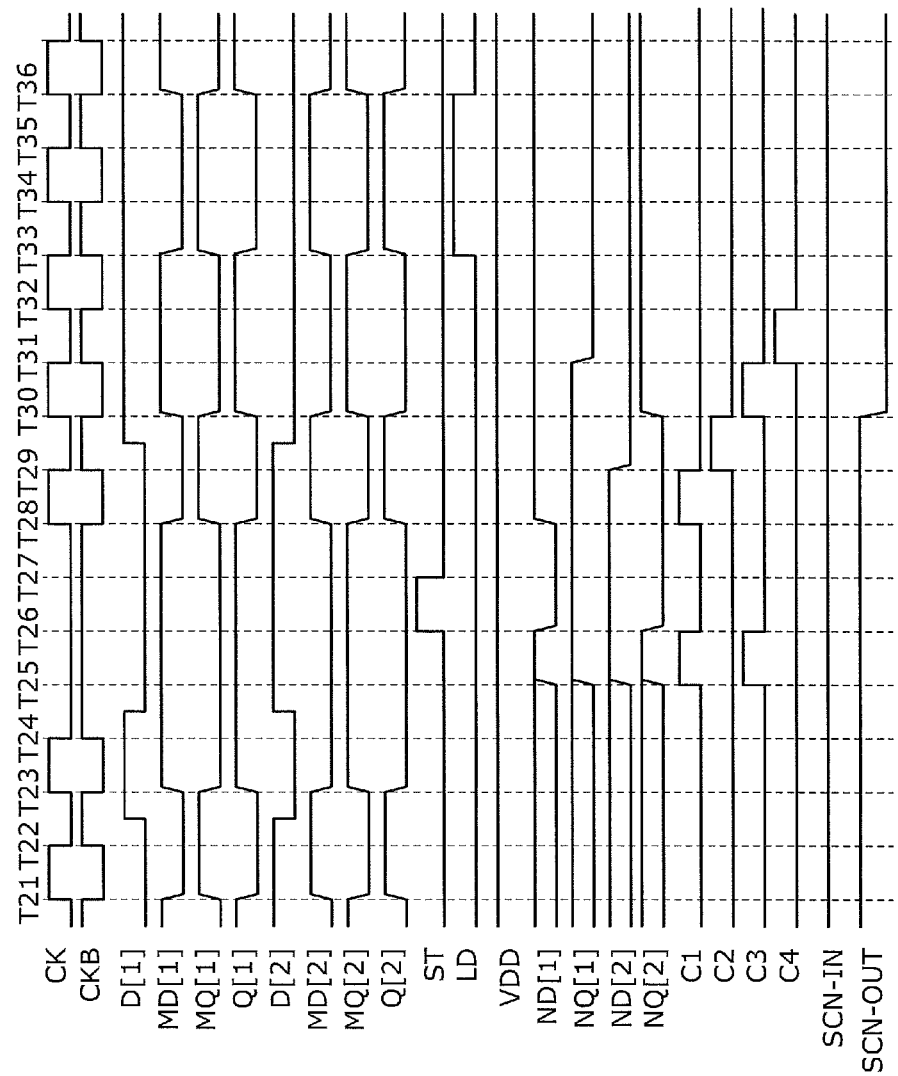
FIG. 5 is a timing chart showing an example of a method for driving the shift register in FIG. 1.

An example of a method for driving the shift register 100 in FIG. 1 is described below using timing charts in FIG. 4 and FIG. 5. FIG. 4 is a timing chart showing an example of a method for driving the shift register 100 when the integrated circuit 10 executes processing. In this operation mode, each of the scan flipflops 110 of the shift register 100 functions as a register of the combination circuit 150. FIG. 5 is a timing chart showing an example of a method for driving the shift register 100 in an operation verification mode of the integrated circuit 10. In the operation verification mode, the shift register 100 functions as a shift register.

In the following description, an H level potential is referred to as H and an L level potential is referred to as L in some cases.

[Driving Method 1; Operation as Register of Combination Circuit]

An example of a driving method of the shift register 100 is described with reference to FIG. 4.

The integrated circuit 10 has a function of power gating in which power supply to a circuit unnecessary for operation is stopped. FIG. 4 shows an example of a driving method of the shift register 100 for saving data of the scan flipflop 110 and restoring the data to perform power gating in the integrated circuit 10. Operation modes of the shift register 100 shown in FIG. 4 are as follows.

Time T1 to Time T5 are in a normal operation mode. Time T5 to Time T8 are in a transition mode for operation stop. Time T8 to Time T9 are in an operation stop mode. Time T9 to Time T12 are in a transition mode for operation restart. Time T12 to Time T15 are in a normal operation mode.

<T1 to T5: Normal Operation Mode>

In the normal operation mode, SCN-FFs[1] and [2] function as registers. From Time T1 to Time T5, the set signal ST and the load signal LD are each at the L level and the clock signals C1 to C4 are each at the L level. In each of the SCN-FFs[1] and [2], control signals are supplied to only the MemAs[1] and [2]. Therefore, the MemAs[1] and [2] each function as a register. The clock signal CK and the inversion signal CKB thereof by which oscillation occurs in a predetermined cycle are input to the MemAs[1] and [2]. When the signal CK is at the H level, the terminals Q[1] and Q[2] hold the same potentials as those of the terminals D[1] and D[2] at the same point. Note that signal delay actually occurs; thus, the potentials of the terminals Q[1] and [2] are changed after the clock signal CK rises.

<T5 to T8: Transition Mode for Operation Stop>

In the transition mode for operation stop, processing for stopping power supply to the shift register 100 is performed. Specifically, processing for saving data held in the MemAs[1] and [2] to the MemBs[1] and [2] is performed. Note that stopping power supply to the shift register 100 means setting the potential difference between VDD and VSS to 0 V by setting VDD to the L level.

From Time T5 to Time T8, the signal CK is kept at L and the signal CKB is kept at H. First, nodes (ND[1] and NQ[1]) of the MemB[1] and nodes (ND[2] and NQ[2]) of the MemB[2] are precharged. From Time T5 to Time T6, the clock signal C1 and the clock signal C3 are each set to the H level, so that the potentials of these nodes are each set to the H level.

Next, data set operation is performed. From Time T6 to Time T7, the signal ST is set to H; data corresponding to the potentials of the nodes (MD[1] and MQ[1]) of the MemA[1] is written to the nodes (ND[1] and NQ[1]) of the MemB[1], and data corresponding to the potentials of the nodes (MD[2] and MQ[2]) of the MemA[2] is written to the nodes (ND[2] and NQ[2]) of the MemB [2]. Here, L is written to the node ND[1], H is written to the node NQ[1], H is written to the node ND[2], and L is written to the node NQ[2].

At Time T7, the signal ST falls and comes to be at the L level; thus, each of the nodes (ND[1], NQ[1], ND[2], and NQ[2]) is in a state where a potential is held.

Next, at Time T8, VDD is set to the L level. That is, a power supply potential is interrupted. At this time, the terminals D[1], D[2], Q[1], and Q[2] become L, and input and output of signals are stopped. Further, supply of the signals CK and CKB is stopped. Consequently, the signals CK and CKB become L.

<T8 to T9: Operation Stop Mode>

In the operation stop mode from Time T8 to Time T9, the power supply voltage is interrupted and all the potentials of the clock signals (CK and CKB), the input terminals (D[1] and D[2]), and the output terminals (Q[1] and Q[2]) are L. Thus, in the integrated circuit 10 including the shift register 100, data can be held in the MemBs[1] and [2] with no power consumption.

<T9 to T12: Transition Mode for Operation Restart>

In the transition mode for operation restart from Time T9 to Time T12, operation for restoring the SCN-FFs[1] and [2] to the state at the time when the normal operation mode is finished, that is, at Time T5. Specifically, operation of writing data stored in the MemBs[1] and [2] to the MemAs[1] and [2] is performed.

At Time T9, the potentials of the signals CK and CKB are set to those at Time T5. Here, the signal CK is set to L and the signal CKB is set to H. Subsequently, at Time T10, the signal LD is set to H, and at Time T11, the potential of VDD is set to the H level. In other words, power supply to the scan flipflop 110 is restarted. Since VDD at the H level is supplied in a state where the signal LD is at the L level, potentials corresponding to the data held in the nodes (ND[1] and NQ[1]) of the MemB[1] are written to the nodes (MD[1] and MQ[1]) of the MemA[1], and potentials corresponding to the data held in the nodes (ND[2] and NQ[2]) of the MemB[2] are written to the nodes (MD[2] and MQ[2]) of the MemA[2]. Thus, the SCN-FFs[1] and [2] are returned to the state at Time T5.

At Time T12, the signal LD is set to the L level and thus supply of the clock signals CK and CKB is restarted, so that the shift register 100 is returned to the normal operation mode. In the normal operation mode after Time T12, the integrated circuit 10 can continue the processing from the state at Time T5.

Consequently, with the use of the driving method in FIG. 4, power of the integrated circuit 10 including the shift register 100 can be turned off as appropriate. Further, the scan flipflop 110 includes a backup portion for data therein; thus, overhead power and overhead time in data saving and data restoring can be reduced. Accordingly, the effect of power reduction owing to power supply interruption can be increased.

[Driving Method 2; Operation as Shift Register in Operation Verification Mode]

FIG. 5 shows an example of a driving method of the shift register 100 in the operation verification mode in the integrated circuit 10. In the operation verification mode, the shift register 100 operates as a shift register. The operation modes of the shift register 100 shown in FIG. 5 are as follows.

Time T21 to Time T25 are in a normal operation mode. Time T25 to Time T27 are in a data set operation mode. Time T28 to Time T32 are in a shift operation mode. Time T33 to Time T36 are in a data load operation mode. A period after Time T36 is in a normal operation mode.

<T21 to T25: Normal Operation Mode>

The operation of the shift register 100 from Time T21 to Time T25 is the same as that from Time T1 to Time T5 in FIG. 4.

<T25 to T27: Data Set Operation Mode>

In the data set operation mode from Time T25 to Time T27, the signal CK is kept at the L level and the signal CKB is kept at the H level; thus, rewriting data in the memory circuit 111 is stopped. From Time T25 to Time T26, the signal C1 and the signal C3 are set to H and the nodes (ND[1], NQ[1], ND[2], and NQ[2]) of the MemCs[1] and [2] are precharged, so that the potentials thereof are set to the H level. In other words, the potentials of the nodes (ND[1], NQ[1], ND[2], and NQ[2]) are reset.

From Time T26 to Time T27, by setting the signal ST to H, potentials corresponding to the data held in the nodes (MD[1] and MQ[1]) of the MemA[1] are written to the nodes (ND[1] and NQ[1]) of the MemC[1], and potentials corresponding to the data held in the nodes (MD[2] and MQ[2]) of the MemA[2] are written to the nodes (ND[2] and NQ[2]) of the MemC[2]. At Time T27, by setting the signal ST to L, the potentials are held in the nodes (ND[1], NQ[1], ND[2], and NQ[2]). Here, L, H, H, and L are held at the nodes ND[1], NQ[1], ND[2], and NQ[2], respectively. Through this data set operation, the data of MemAs[1] and [2] at Time T25 is stored in the MemCs[1] and [2].

<T28 to T32: Shift Operation Mode>

Next, the shift operation mode from Time T28 to Time T32 is described. As shown in FIG. 5, the signals C1 to C4 are sequentially set to the H level from Time T28 to Time T32, so that data input from the terminal (SCN-IN) is sequentially stored in the nodes (ND[1], NQ[1], ND[2], and NQ[2]), and is extracted from the terminals (SCN-OUT) eventually.

First, from Time T28 to Time T29, the signal C1 is set to H; thus, the potentials of the nodes ND[1] and ND[2] are set to H. In other words, the potentials of the nodes ND[1] and ND[2] on the input sides of the MemCs[1] and [2] are reset.

From Time T29 to Time T30, the signal C2 is set to H, so that a potential corresponding to data of the terminal (SCN-IN) is supplied to the node ND[1] of the MemC[1] and a potential corresponding to data of the node NQ[1] of the MemC[1] is supplied to the node ND[2] of the MemC[2]. Here, H is supplied to the node ND[1] and L is supplied to the node ND[2].

From Time T30 to Time T31, by setting the signal C3 to H, the potentials of the nodes NQ[1] and NQ[2] are set to H. In other words, the potentials of the nodes NQ[1] and NQ[2] on the output side of the MemCs[1] and [2] are reset.

Next, from Time T31 to Time T32, by setting the signal C4 to H, in the MemC[1], the potential corresponding to the data of the node ND[1] is supplied to the node NQ[1] and in the MemC[2], the potential corresponding to the data of the node ND[2] is supplied to the node NQ[2]. Here, L is supplied to the node NQ[1] and H is supplied to the node NQ[2].

From Time T31 to Time T32, the potential corresponding to the data held in the node NQ[2], here L, is output to the terminal (SCN-OUT). The data output from the terminal (SCN-OUT) corresponds to the data held in the node NQ[1] through the data set operation from Time T25 to Time T27. In other words, through the shift operation of the shift register 100, the data held in the MemC[1] is transferred to the MemC[2] in the next stage.

<T33 to T36: Data Load Operation Mode>

From Time T33 to Time T36, the data load operation is performed. By setting the signal LD to H, potentials corresponding to the data in the nodes (ND[1] and NQ[1]) of the MemC[1] are written to the nodes (MD[1] and MQ[1]) of the MemA[1] and potentials corresponding to the data in the nodes (ND[2] and NQ[2]) of the MemC[2] are written to the nodes (MD[2] and MQ[2]) of the MemA[2]. Here, the node MD[1] is at L, the node MQ[1] is at H, and the node MD[2] is at H. Further, the node MQ[2] is at L, the terminal Q[1] of the MemA[1] is at L, and the terminal Q[2] of the MemA[2] is at H. In other words, given data input to the shift register 100 can be set at the MemA[1] and the MemA[2] through the terminal (SCN-IN).

As described above, the shift register 100 can extract data of the SCN-FFs[1] and [2] at given time to an external device and set given data in the SCN-FFs[1] and [2] from the external device. Thus, operation of the integrated circuit 10 including the shift register 100 can restart from a given circuit state. With the use of the shift register 100, failure analysis of the integrated circuit 10 can be performed more effectively.

In addition, in the SCN-FFs[1] and [2], the MemBs[1] and [2] for backup and the MemCs[1] and [2] for data transfer can be provided without limitation on the functions of the MemAs [1] and [2] as a register of the combination circuit.

This embodiment can be implemented in appropriate combination with any of the other embodiments.

Embodiment 2

The shift register 100 described in Embodiment 1 and functional circuits such as a combination circuit can be incorporated in one IC chip. In this embodiment, a structure example in which an integrated circuit capable of a scan test is used as one IC chip.

Figure 6:
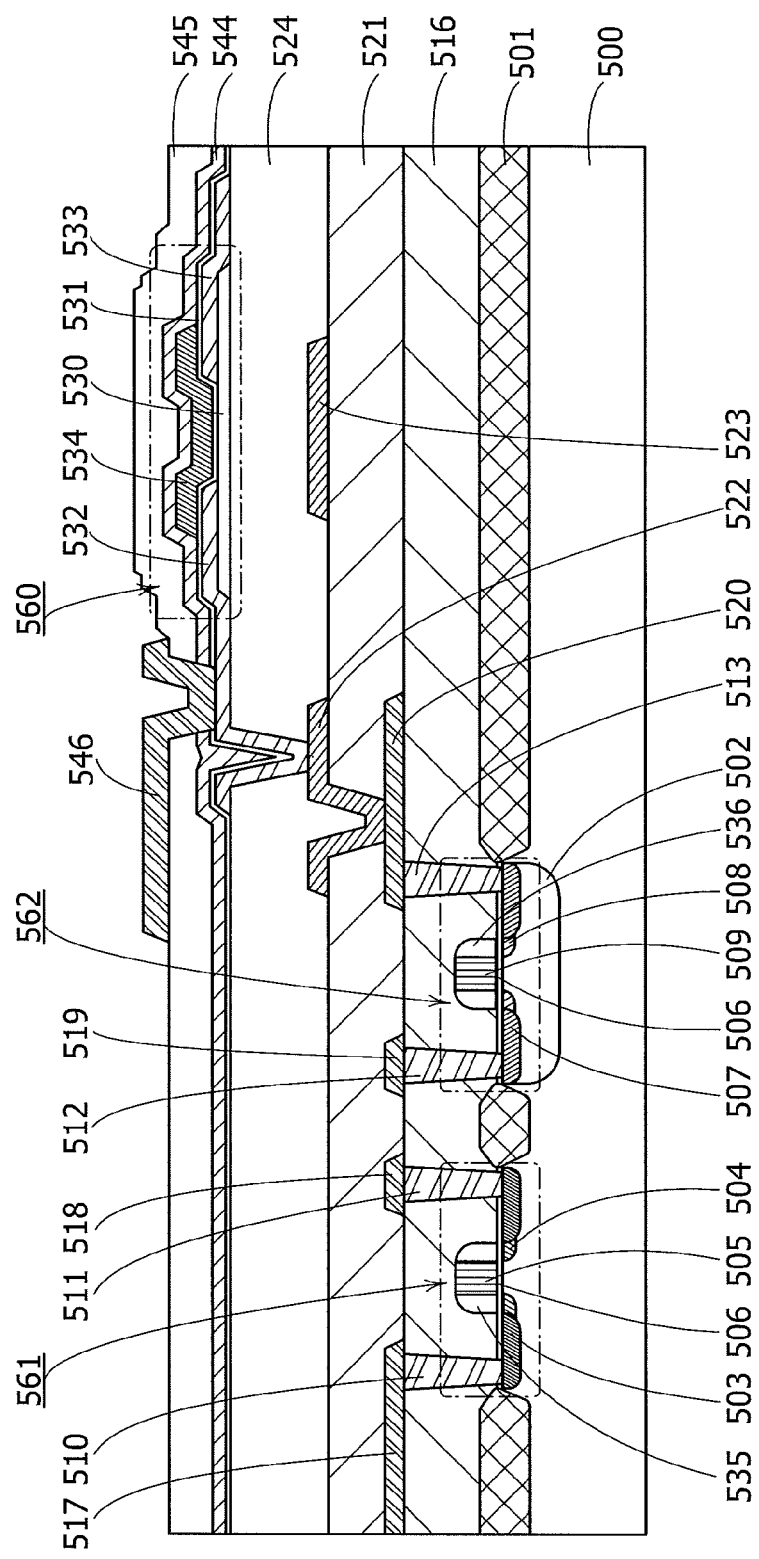
FIG. 6 is a cross-sectional view illustrating a structure example of an integrated circuit.

FIG. 6 illustrates an example of a cross-sectional structure of an integrated circuit. In FIG. 6, an OS transistor including a channel formation region in an oxide semiconductor layer and two transistors each including a channel formation region in a semiconductor substrate are illustrated as main elements included in the integrated circuit. Note that the cross-sectional view in FIG. 6 is not a cross-sectional view taken along a specific portion of the integrated circuit but a cross-sectional view for illustrating a layered structure of the integrated circuit.

A semiconductor substrate 500 can be, for example, an n-type or p-type single crystal silicon substrate, compound semiconductor substrate (e.g., a GaAs substrate, an InP substrate, a GaN substrate, a SiC substrate, or a ZnSe substrate), or the like. In FIG. 6, the case where a single crystal silicon substrate having n-type conductivity is used is illustrated as an example.

In this specification, a transistor formed using a silicon substrate is referred to as a Si transistor in some cases.

As illustrated in FIG. 6, a Si transistor 561 and a Si transistor 562 are formed on the semiconductor substrate 500. The Si transistor 561 is a p-channel transistor and the Si transistor 562 is an n-channel transistor.

An OS transistor 560 is used as the transistors 221 to 224 of the memory circuit 112 and the transistors 231 to 236 of the memory circuit 113 of the shift register 100 (see FIG. 1). The Si transistors 561 and 562 are used as other transistors provided in the integrated circuit.

When both of an OS transistor and a Si transistor are used as transistors included in the integrated circuit, part of the memory circuit 112 (MemB) and the memory circuit 113 (MemC) can be stacked over the memory circuit 111 (MemA) in the shift register 100. In other words, when the shift register for a scan test is included in the integrated circuit, the memory circuit for backup and the memory circuit for data transfer can be stacked over the memory circuit originally provided as a register; thus, an increase in chip area can be suppressed.

The films forming the integrated circuit in this embodiment can be formed by a thermal oxidation method, a CVD method, an MBE method, a sputtering method, or the like. Although a conductive film can be formed by a sputtering method, for example, another method, e.g., a thermal CVD method, may be employed. A metal organic chemical vapor deposition (MOCVD) method or an atomic layer deposition (ALD) method may be employed as an example of a thermal CVD method.

For example, in the case where a tungsten film is formed using a deposition apparatus employing ALD, a $WF_6$ gas and a $B_2H_6$ gas are sequentially introduced more than once to form an initial tungsten film, and then a $WF_6$ gas and an $H_2$ gas are introduced at a time, so that a tungsten film is formed. Note that a $SiH_4$ gas may be used instead of a $B_2H_6$ gas.

The Si transistors 561 and 562 are electrically isolated from each other by an element isolation insulating film 501. The element isolation insulating film 501 can be formed by a local oxidation of silicon (LOCOS) method, a trench isolation method, or the like. The semiconductor substrate 500 may be an SOI type semiconductor substrate. In this case, element isolation is conducted by dividing a semiconductor layer into elements by etching.

In a region where the Si transistor 562 is to be formed, a p-well 502 is formed by selective addition of an impurity element imparting p-type conductivity.

The Si transistor 561 includes an impurity region 503, a low concentration impurity region 504, a gate electrode 505, and a gate insulating film 506 formed between the gate electrode 505 and the semiconductor substrate 500. The gate electrode 505 includes a sidewall 535 in its periphery.

The Si transistor 562 includes an impurity region 507, a low concentration impurity region 508, a gate electrode 509, and the gate insulating film 506. The gate electrode 509 includes a sidewall 536 in its periphery.

An insulating film 516 is formed over the Si transistors 561 and 562. Opening portions are formed in the insulating film 516, and a wiring 510 and a wiring 511 are formed to be in contact with the impurity regions 503, and a wiring 512 and a wiring 513 are formed to be in contact with the impurity regions 507.

The wiring 510 is connected to a wiring 517 formed over the insulating film 516, the wiring 511 is connected to a wiring 518 formed over the insulating film 516, the wiring 512 is connected to a wiring 519 formed over the insulating film 516, and the wiring 513 is connected to a wiring 520 formed over the insulating film 516.

An insulating film 521 is formed over the wirings 517 to 520. An opening portion is formed in the insulating film 521, a wiring 522 and a wiring 523 connected to the wiring 520 in the opening portion are formed over the insulating film 521. In addition, an insulating film 524 is formed over the wiring 522 and the wiring 523.

The OS transistor 560 having an oxide semiconductor layer 530 is formed over the insulating film 524. The OS transistor 560 includes a conductive film 532 and a conductive film 533 each of which serves as a source electrode or a drain electrode, a gate insulating film 531, and a gate electrode 534 over the oxide semiconductor layer 530. The conductive film 532 is connected to the wiring 522 in the opening portion formed in the insulating film 524.

The wiring 523 is overlapped with the oxide semiconductor layer 530 with the insulating film 524 provided therebetween. The wiring 523 acts as a backgate of the OS transistor 560. The threshold voltage of the OS transistor 560 can be controlled in accordance with a potential supplied to the wiring 523. The wiring 523 can be formed as needed.

The OS transistor 560 is covered with an insulating film 544 and an insulating film 545. The insulating film 544 is preferably an insulating film that can prevent hydrogen released from the insulating film 545 from entering the oxide semiconductor layer 530. Examples of such an insulating film are a silicon nitride film and the like.

A conductive film 546 is formed over the insulating film 545. The conductive film 546 is in contact with the conductive film 532 in an opening portion formed in the insulating film 544, the insulating film 545, and the gate insulating film 531.

The thickness of the oxide semiconductor layer 530 is preferably from 2 nm to 40 nm. In the oxide semiconductor layer 530, a region where a channel formation region of the OS transistor 560 is formed is preferably an i-type (intrinsic) or substantially intrinsic oxide semiconductor. An oxide semiconductor layer in which impurities serving as electron donors (donors), such as moisture and hydrogen, and which includes reduced oxygen vacancies is an intrinsic (i-type) semiconductor or a substantially i-type semiconductor. Here, such an oxide semiconductor layer is referred to as a highly-purified oxide semiconductor layer. A transistor whose channel is formed using a highly-purified oxide semiconductor layer has an extremely low off-state current and high reliability.

The carrier density of the oxide semiconductor layer 530 is preferably $1\times10^{13}/cm^3$ or lower, more preferably $1\times10^{16}/cm^3$ or lower, $1\times10^{15}/cm^3$ or lower, $1\times10^{14}/cm^3$ or lower, or $1\times10^{13}/cm^3$ or lower, to manufacture a transistor with low off-state current.

The source-drain current (off-state current) of the OS transistor 560 in an off state can be $1\times10^{-18}$ A or lower at room temperature (about 25° C.) as the result of using the oxide semiconductor layer 530. The off-state current at room temperature (about 25° C.) is preferably $1\times10^{-21}$ A or lower, more preferably $1\times10^{-24}$ A or lower. Alternatively, at 85° C., the off-state current value can be $1\times10^{-15}$ A or lower, preferably, $1\times10^{-18}$ A or lower, more preferably $1\times10^{-21}$ A or lower. An off state of a transistor refers to a state where a gate voltage is much lower than a threshold voltage in an n-channel transistor. Specifically, the transistor is in an off state when the gate voltage is lower than the threshold voltage by 1 V or more, 2 V or more, or 3 V or more.

Some experiments prove that the off-state current of the transistor using an oxide semiconductor layer is extremely low. For example, the following measurement data was obtained: a transistor with a channel width of $1\times10^6$ μm and a channel length of 10 μm can have an off-state current less than or equal to the measurement limit of a semiconductor parameter analyzer, that is, less than or equal to $1\times10^{-13}$ A when the voltage (drain voltage) between a source and a drain ranges between 1 V and 10 V. In that case, it can be seen that off-state current standardized on the channel width of the transistor is 100 zA/μm or lower.

In another experiment, off-state current is measured with a circuit in which a capacitor and a transistor are connected to each other and charge flowing to or from the capacitor is controlled by the transistor. In this case, the off-state current is measured from a change in the amount of charge of the capacitor per unit time. As a result, it is found that when the drain voltage is 3 V, an off-state current of several tens of yoctoamperes per micrometer (yA/μm) can be achieved. Accordingly, the off-state current of the transistor in which the highly-purified oxide semiconductor layer is used as a channel formation region is considerably lower than that of a transistor using silicon having crystallinity.

The oxide semiconductor layer 530 is preferably formed using an oxide containing at least one element selected from In, Ga, Sn, and Zn. As such an oxide, an In—Sn—Ga—Zn oxide, an In—Ga—Zn oxide, an In—Sn—Zn oxide, an In—Al—Zn oxide, a Sn—Ga—Zn oxide, an Al—Ga—Zn oxide, a Sn—Al—Zn oxide, an In—Zn oxide, a Sn—Zn oxide, an Al—Zn oxide, a Zn—Mg oxide, a Sn—Mg oxide, an In—Mg oxide, an In—Ga oxide, an In oxide, a Sn oxide, a Zn oxide, or the like can be used. In addition, the oxide may contain an element other than In, Ga, Sn, and Zn, for example, an oxide semiconductor containing $SiO_2$.

Note that, for example, an In—Ga—Zn oxide means an oxide containing In, Ga, and Zn and there is no particular limitation on the atomic ratio of In, Ga, and Zn.

A structure of an oxide semiconductor film forming the oxide semiconductor layer 530 is described below. In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly also includes the case where the angle is greater than or equal to 85° and less than or equal to 95°. Further, the trigonal and rhombohedral crystal systems are included in the hexagonal crystal system.

An oxide semiconductor film is classified roughly into a non-single-crystal oxide semiconductor film and a single-crystal oxide semiconductor film. The non-single-crystal oxide semiconductor film includes any of a c-axis aligned crystalline oxide semiconductor (CAAC-OS) film, a poly-crystalline oxide semiconductor film, a microcrystalline oxide semiconductor film, an amorphous oxide semiconductor film, and the like. The oxide semiconductor layer 530 may be a stacked film including two or more films of an amorphous oxide semiconductor film, a microcrystalline oxide semiconductor film, and a CAAC-OS film, for example. In the case where the oxide semiconductor layer 530 has such a plurality of structures, nanobeam electron diffraction enables analysis of the structures in some cases.

First, a CAAC-OS film will be described.

The CAAC-OS film is one of oxide semiconductor films having a plurality of c-axis aligned crystal parts.

In a transmission electron microscope GEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

According to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 $nm^2$ or more, 5 $nm^2$ or more, or 1000 $μm^2$ or more is observed in some cases in the plan TEM image.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface of the CAAC-OS film. Thus, for example, if a shape of the CAAC-OS film is changed by etching or the like, the c-axis may not be parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, the region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak of $2\theta$ might also be observed at around 36°, in addition to the peak of $2\theta$ at around 31°. The peak of 28 at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

The CAAC-OS film is an oxide semiconductor film having a low impurity concentration. The impurity is an element other than the main components of the oxide semiconductor film, such as hydrogen, carbon, silicon, or a transition metal element. In particular, an element that has higher bonding strength to oxygen than that of a metal element, e.g., silicon, included in the oxide semiconductor film disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Charges captured by the carrier traps in the oxide semiconductor film take a long time to be released, and may behave like fixed charges. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film will be described.

In a TEM image of the microcrystalline oxide semiconductor film, crystal parts cannot be found clearly sometimes. In most cases, the size of a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a TEM image of the nc-OS film, a grain boundary cannot be found clearly in the nc-OS film sometimes for example.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation is not observed in the whole film. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than a crystal part, a peak which shows a crystal plane does not appear. Further, a halo pattern is shown in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film which is obtained by using an electron beam having a probe diameter close to or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film having more regularity than that of an amorphous oxide semiconductor film; thus, the nc-OS film has a lower density of defect states than that of an amorphous oxide semiconductor film. However, there is no regularity of crystal orientation between different crystal parts in the nc-OS film; hence, the nc-OS film has a higher density of defect states than that of a CAAC-OS film.

A formation method of the CAAC-OS film is described below.

For example, the CAAC-OS film is formed with a polycrystalline oxide semiconductor sputtering target by a sputtering method. When ions collide with the sputtering target, a crystal region included in the sputtering target might be separated from the target along an a-b plane; in other words, a sputtered particle having a plane parallel to an a-b plane (flat-plate-like sputtered particle or pellet-like sputtered particle) might be separated from the sputtering target. In that case, the flat-plate-like sputtered particle reaches a substrate while maintaining its crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, and nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is from 100° C. to 740° C., preferably from 200° C. to 500° C. By increasing the substrate heating temperature during the deposition, when the flat-plate-like sputtered particle reaches the substrate, migration occurs on the substrate surface, so that a flat plane of the flat-plate-like sputtered particles is attached to the substrate.

Furthermore, preferably, the proportion of oxygen in the deposition gas is increased and the power is optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made as follows: $InO_X$ powder, $GaO_Y$ powder, and $ZnO_Z$ powder are mixed in a predetermined molar ratio, pressure is applied to the mixture, and heat treatment is performed thereto at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on a desired sputtering target.

Alternatively, the CAAC-OS film can be formed by a plurality of times of deposition of films. An example of such a method is described below.

First, a first oxide semiconductor layer is formed to a thickness of 1 nm or more and less than 10 nm. The first oxide semiconductor layer is formed by a sputtering method. Specifically, the substrate temperature during the deposition is higher than or equal to 100° C. and lower than or equal to 500° C., preferably, higher than or equal to 150° C. and lower than or equal to 450° C., and the oxygen ratio in a deposition gas is 30 vol % or more, preferably 100 vol %.

Then, heat treatment is performed to increase the crystallinity of the first oxide semiconductor layer to give the first CAAC-OS film with high crystallinity. The temperature of the heat treatment is higher than or equal to 350° C. and lower than or equal to 740° C., preferably higher than or equal to 450° C. and lower than or equal to 650° C. Further, the heat treatment is performed for 1 minute to 24 hours, preferably 6 minutes to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the first oxide semiconductor layer for a short time. At the same time, the heat treatment in an inert atmosphere may generate oxygen vacancies in the first oxide semiconductor layer. In this case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under a reduced pressure can reduce the concentration of impurities in the first oxide semiconductor layer for a shorter time.

Because the first oxide semiconductor layer has a thickness of 1 nm or more and less than 10 nm, the first oxide semiconductor layer can be more easily crystallized than that having a thickness of 10 nm or more.

Then, a second oxide semiconductor layer having the same composition as the first oxide semiconductor layer is formed to a thickness of from 10 nm to 50 nm. The second oxide semiconductor layer is formed by a sputtering method. Specifically, the substrate temperature during the deposition is higher than or equal to 100° C. and lower than or equal to 500° C., preferably, higher than or equal to 150° C. and lower than or equal to 450° C., and the oxygen ratio in a deposition gas is 30 vol % or more, preferably 100 vol %.

Then, heat treatment is conducted so that the second oxide semiconductor layer is turned into a second CAAC-OS film with high crystallinity by solid phase growth from the first CAAC-OS film. The temperature of the heat treatment is higher than or equal to 350° C. and lower than or equal to 740° C., preferably higher than or equal to 450° C. and lower than or equal to 650° C. Further, the heat treatment is performed for 1 minute to 24 hours, preferably 6 minutes to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the second oxide semiconductor layer for a short time. At the same time, the heat treatment in an inert atmosphere may generate oxygen vacancies in the second oxide semiconductor layer. In this case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under a reduced pressure can reduce the concentration of impurities in the second oxide semiconductor layer for a shorter time.

This embodiment can be implemented in appropriate combination with any of the other embodiments.

Embodiment 3

In this embodiment, a structure and a manufacturing method of an oxide semiconductor transistor are described with reference to FIGS. 7A to 7C, FIGS. 8A to 8C, FIGS. 9A and 9B, FIGS. 10A to 10C, FIGS. 11A to 11D, and FIGS. 12A to 12D. The oxide semiconductor transistor in this embodiment can be manufactured, for example, as the OS transistor 560 of the integrated circuit in FIG. 6.

<Structure Example 1 of OS Transistor>

Figure 7A:
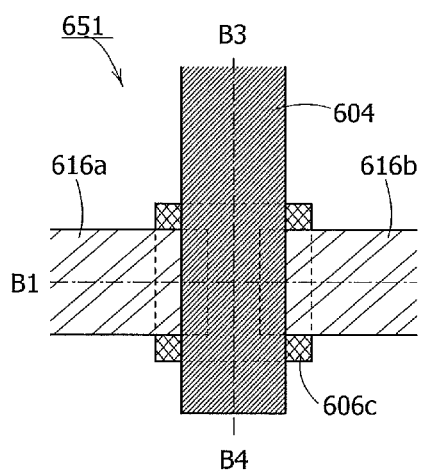
FIG. 7A is a top view illustrating a structure example of an oxide semiconductor transistor.
Figure 7C:
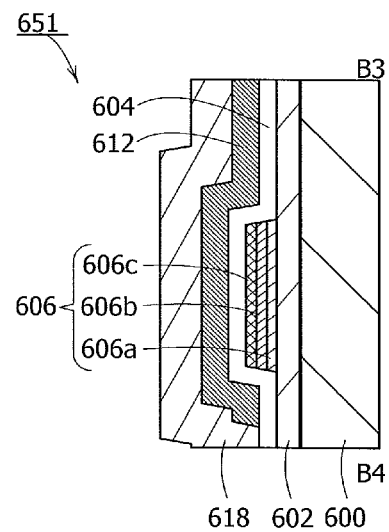
FIG. 7C is a cross-sectional view taken along line B3-B4 in FIG. 7A.
Figure 7B:
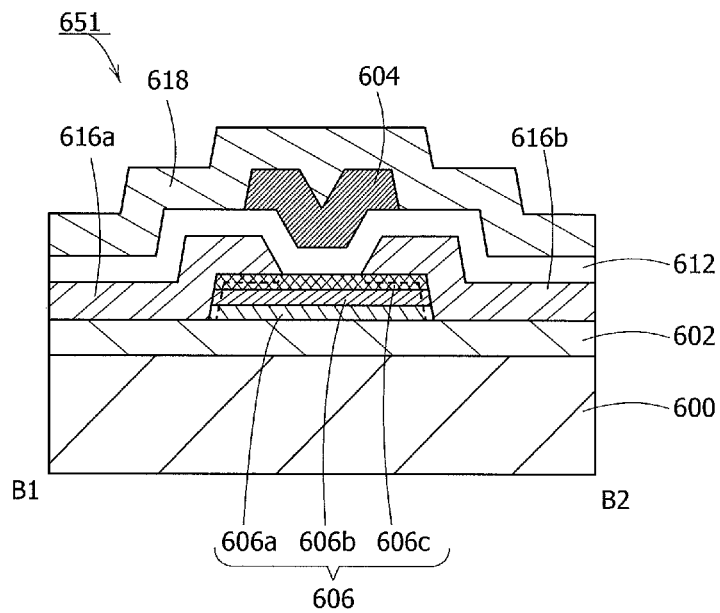
FIG. 7B is a cross-sectional view taken along line B1-B2 in FIG. 7A.

FIGS. 7A to 7C show a structure example of a top-gate OS transistor. FIG. 7A is a top view of an OS transistor 651, FIG. 7B is a cross-sectional view taken along line B1-B2 in FIG. 7A, and FIG. 7C is a cross-sectional view taken along line B3-B4 in FIG. 7A.

As illustrated in FIG. 7B, the OS transistor 651 includes a base insulating film 602 over a substrate 600, a multilayer film 606 over the base insulating film 602, a source electrode 616a, a drain electrode 616b, a gate insulating film 612, a gate electrode 604, and a protective insulating film 618.

The gate insulating film 612 is provided over the source electrode 616a and the drain electrode 616b. The source electrode 616a and the drain electrode 616b are provided over the base insulating film 602 and the multilayer film 606. The source electrode 616a and the drain electrode 616b are provided in contact with side edges of the multilayer film 606. The protective insulating film 618 is provided over the gate insulating film 612 and the gate electrode 604.

The multilayer film 606 includes an oxide layer 606a over the base insulating film 602, the oxide semiconductor layer 606b over the oxide layer 606a, and an oxide layer 606c over the oxide semiconductor layer 606b.

Although the multilayer film 606 in the OS transistor 651 described here has a three-layer structure, the number of layers which are stacked is not limited to three and the multilayer film 606 includes a plurality of oxide layers to be stacked; a two-layer structure or a four-layer structure may be employed. The multilayer film 606 can have a two-layer structure of the oxide layer 606a and the oxide semiconductor layer 606b, for example.

Although the base insulating film 602 and the protective insulating film 618 are included in the OS transistor 651 here, one or both of these films are not necessarily included as films included in the OS transistor 651.

As illustrated in FIG. 7B, depending on a kind of a conductive film used for the source electrode 616a and the drain electrode 616b, part of the multilayer film 606 is deprived of oxygen by the source electrode 616a and the drain electrode 616b, whereby n-type regions (the source region and the drain region) may be partly formed in the multilayer film 606. In FIG. 7B, an example where such n-type regions are formed is shown and the boundaries of the n-type regions are indicated by dotted lines.

The n-type region is a region where many oxygen vacancies exist in the multilayer film 606. Further, a component of the source electrode 616a and the drain electrode 616b is mixed into the n-type regions; for example, in the case where a tungsten film is used for the source electrode 616a and the drain electrode 616b, an element of tungsten is mixed into the n-type regions. Further, although not illustrated, oxygen in the multilayer film 606 is mixed into regions of the source electrode 616a and the drain electrode 616b which are in contact with the multilayer film 606, so that mixed layers are formed in the region in some cases.

In FIG. 7A, in a region which overlaps with the gate electrode 604, a distance between the source electrode 616a and the drain electrode 616b is referred to as a channel length. Note that in the case where the OS transistor 651 includes the source region and the drain region, a distance between the source region and the drain region in the region overlapping with the gate electrode 604 may be referred to as a channel length.

Note that a channel formation region corresponds to a region of the multilayer film 606 which overlaps with the gate electrode 604 and does not overlap with the source electrode 616a and the drain electrode 616b. Further, the channel corresponds to a region of the channel formation region, where current mainly flows. Here, the channel is part of the oxide semiconductor layer 606b in the channel formation region.

The oxide layer 606c contains one or more kinds of elements contained in the oxide semiconductor layer 606b. The energy of the bottom of the conduction band in the oxide layer 606c is located closer to the vacuum level than that in the oxide semiconductor layer 606b by 0.05 eV or more, 0.07 eV or more, 0.1 eV or more, or 0.15 eV or more and 2 eV or less, 1 eV or less, 0.5 eV or less, or 0.4 eV or less. Note that to increase carrier mobility of the oxide semiconductor layer 606b, the oxide semiconductor layer 606b preferably contains at least indium. At this time, application of an electric field to the gate electrode 604 forms a channel in the oxide semiconductor layer 606b in the multilayer film 606, where the energy of the bottom of the conduction band is low. That is, when the oxide layer 606c is provided between the oxide semiconductor layer 606b and the gate insulating film 612, the channel of the OS transistor 651 can be formed in the oxide semiconductor layer 606b, which is not in contact with the gate insulating film 612. Further, since the oxide layer 606c contains one or more kinds of elements contained in the oxide semiconductor layer 606b, interface scattering is not likely to occur at the interface between the oxide semiconductor layer 606b and the oxide layer 606c. Thus, carriers are not inhibited from moving at the interface, which results in an increase in the field-effect mobility of the OS transistor 651.

The oxide layer 606c has a thickness greater than or equal to 3 nm and less than or equal to 100 nm, preferably greater than or equal to 3 nm and less than or equal to 50 nm. The oxide semiconductor layer 606b has a thickness greater than or equal to 3 nm and less than or equal to 200 nm, preferably greater than or equal to 3 nm and less than or equal to 100 nm, further preferably greater than or equal to 3 nm and less than or equal to 15 nm. The oxide layer 606a has a thickness greater than or equal to 3 nm and less than or equal to 100 nm, preferably greater than or equal to 3 nm and less than or equal to 50 nm.

The oxide layer 606a contains one or more kinds of elements contained in the oxide semiconductor layer 606b. The energy of the bottom of the conduction band in the oxide layer 606a is located closer to the vacuum level than that in the oxide semiconductor layer 606b by 0.05 eV or more, 0.07 eV or more, 0.1 eV or more, or 0.15 eV or more and 2 eV or less, 1 eV or less, 0.5 eV or less, or 0.4 eV or less. Since the oxide layer 606a contains one or more kinds of elements contained in the oxide semiconductor layer 606b, an interface state is not likely to occur at the interface between the oxide semiconductor layer 606b and the oxide layer 606a. When the interface has an interface state, a second transistor in which the interface serves as a channel is formed and the apparent threshold voltage of the OS transistor 651 varies in some cases. Thus, providing the oxide layer 606a makes it possible to reduce variation in the electrical characteristics of the OS transistor 651, such as threshold voltage.

For example, each of the oxide layer 606a and the oxide layer 606c can be an oxide layer which contains the same elements as the oxide semiconductor layer 606b (i.e., indium, gallium, and zinc) as the main components and in which the atomic ratio of gallium is higher than that of the oxide semiconductor layer 606b. Specifically, an oxide layer in which the atomic ratio of gallium is 1.5 times or more, preferably 2 times or more, further preferably 3 times or more that of the oxide semiconductor layer 606b is used as each of the oxide layer 606a and the oxide layer 606c. Gallium is strongly bonded to oxygen, and thus has a function of preventing generation of oxygen vacancies in the oxide layer. In other words, the oxide layer 606a and the oxide layer 606c are oxide layers in which oxygen vacancies are less likely to occur than in the oxide semiconductor layer 606b.

Note that the oxide layer 606a, the oxide semiconductor layer 606b, and the oxide layer 606c are amorphous or crystalline. It is preferable that the oxide layer 606a be amorphous or crystalline, the oxide semiconductor layer 606b be crystalline, and the oxide layer 606c be amorphous. When the oxide semiconductor layer 606b in which the channel is formed is crystalline, the OS transistor 651 can have stable electrical characteristics.

The other components of the OS transistor 651 are described below.

As the substrate 600, an insulating substrate such as a glass substrate or a quartz substrate can be used. Further, the semiconductor substrate described in Embodiment 2 can be used.

The source electrode 616a and the drain electrode 616b may be formed with a single layer or a stacked layer using one or more conductive films containing one or more of the following elements: aluminum, titanium, chromium, cobalt, nickel, copper, yttrium, zirconium, molybdenum, ruthenium, silver, tantalum, and tungsten. Note that the source electrode 616a and the drain electrode 616b may have the same composition or different compositions. For example, a stack of a tungsten film and a tantalum nitride film is used.

Note that although the multilayer film 606 is formed to extend to the outside of the gate electrode 604 in FIG. 7A, the multilayer film 606 may be formed inside the gate electrode 604 to prevent generation of carriers in the multilayer film 606 due to light.

The base insulating film 602 may be formed to have a single-layer structure or a stacked-layer structure using an insulating film containing one or more kinds of substances such as aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

Note that in this specification, oxynitride refers to a substance which contains more oxygen than nitrogen, and nitride oxide refers to a substance which contains more nitrogen than oxygen.

For example, the base insulating film 602 may be a multilayer film of a silicon nitride layer as the first layer and a silicon oxide layer as the second layer. In this case, a silicon oxynitride layer may be used instead of the silicon oxide layer. In addition, the silicon nitride layer may be a silicon nitride oxide layer. As the silicon oxide layer, a silicon oxide layer with a low defect density is preferably used. Specifically, a silicon oxide layer which has a spin density of $3 \times 10^{17}$ spins/cm$^3$ or less, preferably $5 \times 10^{16}$ spins/cm$^3$ or less corresponding to an electron spin resonance (ESR) signal at a g-factor of 2.001 measured by an ESR spectrometer is used. As the silicon nitride layer, a silicon nitride layer which releases a small amount of hydrogen and a small amount of ammonia is used. The amount of released hydrogen and the amount of released ammonia can be measured by a thermal desorption spectroscopy (TDS) analysis apparatus. Further, a silicon nitride layer which does not transmit or hardly transmits oxygen is used as the silicon nitride layer.

Alternatively, for example, the base insulating film 602 may be a multilayer film of a first silicon nitride layer as the first layer, a first silicon oxide layer as the second layer, and a second silicon oxide layer as the third layer. In that case, the first and/or second silicon oxide layer may be a silicon oxynitride layer. Alternatively, the silicon nitride layer may be a silicon nitride oxide layer. The first silicon oxide layer is preferably a silicon oxide layer with a low defect density. Specifically, a silicon oxide layer which has a spin density of $3 \times 10^{17}$ spins/cm$^3$ or less, preferably $5 \times 10^{16}$ spins/cm$^3$ or less corresponding to an ESR signal at a g-factor of 2.001 is used. As the second silicon oxide layer, a silicon oxide layer containing excess oxygen is used. As the silicon nitride layer, a silicon nitride layer which releases a small amount of hydrogen and a small amount of ammonia is used. Further, a silicon nitride layer which does not transmit or hardly transmits oxygen is used as the silicon nitride layer.

The silicon oxide layer containing excess oxygen refers to a silicon oxide layer which can release oxygen by heat treatment or the like. When the silicon oxide layer is applied broadly to an insulating film, the thus obtained insulating film containing excess oxygen is an insulating film having a function of releasing oxygen by heat treatment.

Here, a film from which oxygen is released by heat treatment may release oxygen, the amount of which is higher than or equal to $1 \times 10^{18}$ atoms/cm$^3$, higher than or equal to $1 \times 10^{19}$ atoms/cm$^3$, or higher than or equal to $1 \times 10^{20}$ atoms/cm$^3$ in TDS analysis in which heat treatment is performed such that a temperature of a film surface is higher than or equal to 100° C. and lower than or equal to 700° C., preferably higher than or equal to 100° C. and lower than or equal to 500° C. (converted into the number of oxygen atoms).

Further, the film from which oxygen is released by heat treatment may contain a peroxide radical. Specifically, the spin density attributed to a peroxide radical is $5 \times 10^{17}$ spins/cm$^3$ or higher. Note that the film containing a peroxide radical may have an asymmetric signal at a g value of around 2.01 in ESR.

The insulating film containing excess oxygen may be formed using oxygen-excess silicon oxide ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by RBS.

In the case where at least one of the gate insulating film 612 and the base insulating film 602 includes an insulating film containing excess oxygen, oxygen vacancies in the oxide semiconductor layer 606b can be reduced.

The protective insulating film 618 may be formed to have a single-layer structure or a stacked-layer structure using an insulating film containing one or more kinds of substances such as aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

In the transistor manufactured in the above manner, a channel is formed in the oxide semiconductor layer 606b of the multilayer film 606; accordingly, the transistor has stable electrical characteristics and high field-effect mobility.

<Example of Manufacturing Method 1 of OS Transistor>

Here, an example of a method for manufacturing the OS transistor 651 is described with reference to FIGS. 8A to 8C and FIGS. 9A and 9B.

First, the substrate 600 over which the base insulating film 602 is formed is prepared. As the base insulating film 602, a silicon oxide layer containing excess oxygen is formed using a sputtering apparatus.

Then, an oxide layer to be the oxide layer 606a is deposited. A 20-nm-thick IGZO (In:Ga:Zn=1:3:2) film is formed as the oxide layer 606a. Note that the deposition of the IGZO (In:Ga:Zn=1:3:2) film is performed under the following deposition conditions: a sputtering apparatus is used; the substrate temperature is 200° C., flow rates of Ar and O$_2$ were 30 sccm and 15 sccm, respectively; the deposition pressure is 0.4 Pa; the deposition power (DC) is 0.5 kW; and a distance between the substrate and the target (T-S distance) is 60 mm.

Then, an oxide semiconductor layer to be the oxide semiconductor layer 606b is deposited. A 15-nm-thick IGZO (In:Ga:Zn=1:1:1) film is formed as the oxide semiconductor layer 606b. Note that the deposition of the IGZO (In:Ga:Zn=1:1:1) film is performed under the following deposition conditions: a sputtering apparatus is used; the substrate temperature is 300° C., flow rates of Ar and O$_2$ are 30 sccm and 15 sccm, respectively; the deposition pressure is 0.4 Pa; the deposition power (DC) is 0.5 kW; and a distance between the substrate and the target (T-S distance) is 60 mm.

Then, an oxide layer to be the oxide layer 606c is deposited. A 5-nm-thick IGZO (In:Ga:Zn=1:3:2) film is formed as the oxide layer 606c. Note that the deposition of the IGZO (In:Ga:Zn=1:3:2) film is performed under the following deposition conditions: a sputtering apparatus is used; the substrate temperature is 200° C., flow rates of Ar and O$_2$ are 30 sccm and 15 sccm, respectively; the deposition pressure is 0.4 Pa; the deposition power (DC) is 0.5 kW; and a distance between the substrate and the target (T-S distance) is 60 mm.

Next, first heat treatment is preferably performed. The first heat treatment can be performed at a temperature higher than or equal to 250° C. and lower than or equal to 650° C., preferably higher than or equal to 300° C. and lower than or equal to 500° C. The first heat treatment is performed in an inert gas atmosphere, an atmosphere containing an oxidizing gas at 10 ppm or more, preferably 1% or more, further preferably 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, preferably 1% or more, further preferably 10% or more in order to compensate desorbed oxygen. By the first heat treatment, the crystallinity of the oxide semiconductor layer to be the oxide semiconductor layer 606b can be increased, and impurities such as hydrogen and water can be removed from the base insulating film 602, the oxide layer to be the oxide layer 606a, the oxide semiconductor layer to be the oxide semiconductor layer 606b and/or the oxide layer to be the oxide layer 606c.

Figure 8A:
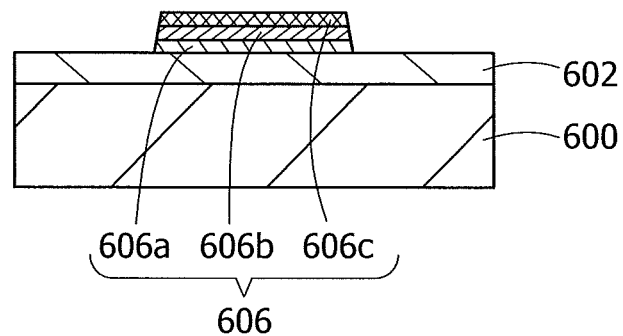
FIGS. 8A to 8C are cross-sectional views illustrating an example of a method for manufacturing the transistor in FIG. 7A.
Figure 8B:
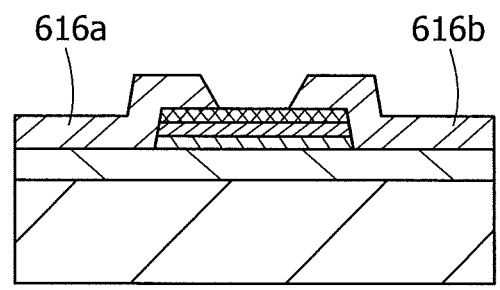

Next, the oxide layer to be the oxide layer 606a, the oxide semiconductor layer to be the oxide semiconductor layer 606b, and the oxide layer to be the oxide layer 606c are partly etched to form the multilayer film 606 including the oxide layer 606a, the oxide semiconductor layer 606b, and the oxide layer 606c (see FIG. 8A).

Next, a conductive film to be the source electrode 616a and the drain electrode 616b is formed. Next, this conductive film is partly etched to form the source electrode 616a and the drain electrode 616b (see FIG. 8B).

Next, second heat treatment is preferably performed. The second heat treatment can be performed in a manner similar to that of the first heat treatment. By the second heat treatment, impurities such as hydrogen and water can be removed from the multilayer film 606.

Figure 8C:
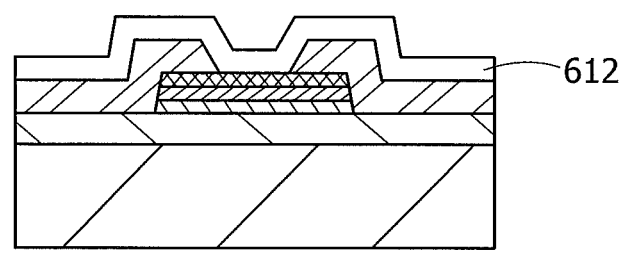
Figure 9A:
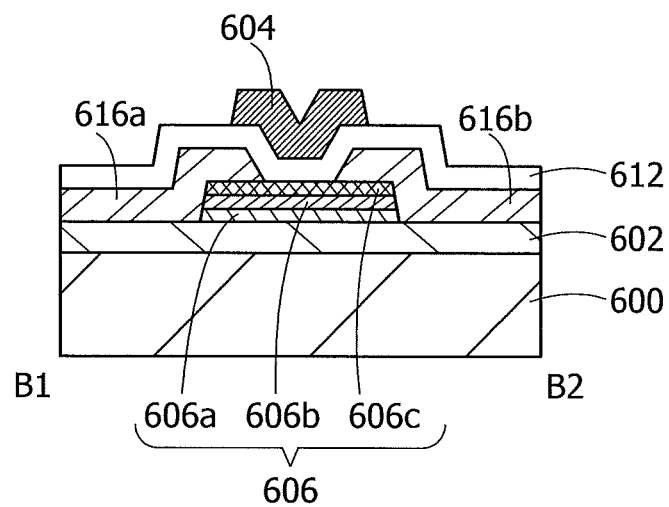
FIGS. 9A and 9B are cross-sectional views illustrating the example of the method for manufacturing the transistor in FIG. 7A.
Figure 9B:
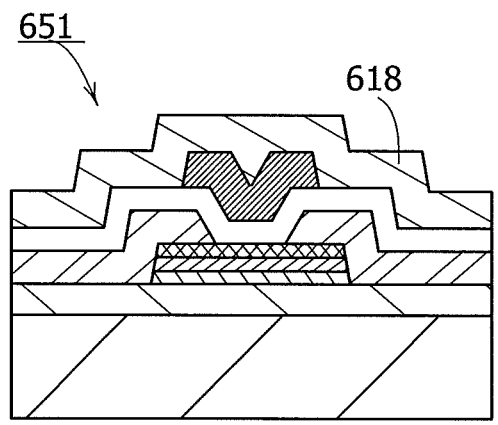

Then, the gate insulating film 612 is formed (see FIG. 8C). The gate insulating film 612 may be a multilayer film including a first silicon oxide layer as the first layer, a second silicon oxide layer as the second layer, and a silicon nitride layer as the third layer. In that case, the first silicon oxide layer and/or the second silicon oxide layer may be a silicon oxynitride layer. Further, the silicon nitride layer may be a silicon nitride oxide layer. The first silicon oxide layer is preferably a silicon oxide layer with a low defect density. Specifically, a silicon oxide layer which has a spin density of $3 \times 10^{17}$ spins/cm$^3$ or less, preferably $5 \times 10^{16}$ spins/cm$^3$ or less corresponding to a signal at a g-factor of 2.001 in ESR is used. As the second oxide layer, a silicon oxide layer containing excess oxygen is used. As the silicon nitride layer, a silicon nitride layer from which hydrogen and ammonia are less likely to be released is used. Further, a silicon nitride layer which does not transmit or hardly transmits oxygen is used.

Next, a conductive film to be the gate electrode 604 is formed. Then, this conductive film is partly etched to form the gate electrode 604 (see FIG. 9A). Subsequently, the protective insulating film 618 is deposited (see FIG. 9B).

In this manner, the OS transistor 651 can be manufactured.

Since oxygen vacancies in the oxide semiconductor layer 606b of the multilayer film 606 are reduced, the OS transistor 651 has stable electrical characteristics.

<Structure Example 2 of OS Transistor>

Next, an example of an OS transistor having a structure different from that of the OS transistor 651 is described with reference to FIGS. 10A to 10C.

Figure 10A:
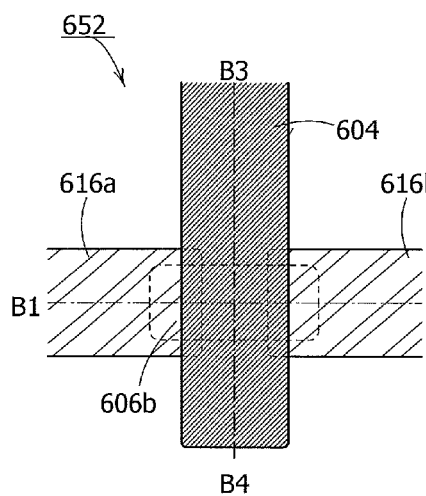
FIG. 10A is a top view illustrating a structure example of an oxide semiconductor transistor.
Figure 10C:
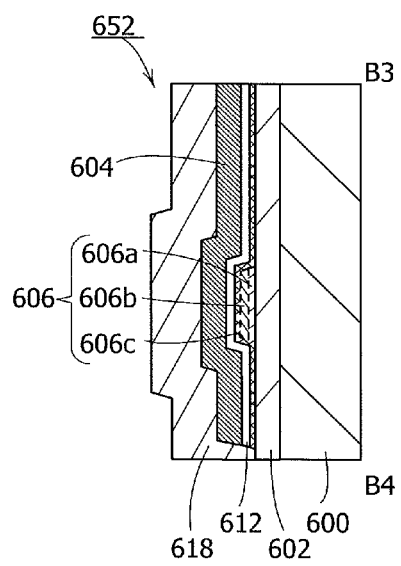
FIG. 10C is a cross-sectional view taken along line B3-B4 in FIG. 10A.
Figure 10B:
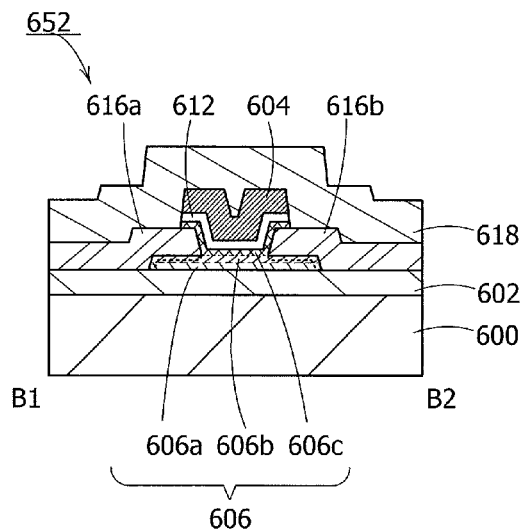
FIG. 10B is a cross-sectional view taken along line B1-B2 in FIG. 10A.

FIGS. 10A to 10C show a structure example of a top-gate OS transistor. FIG. 10A is a top view of the OS transistor, FIG. 10B is a cross-sectional view taken along line B1-B2 in FIG. 10A, and FIG. 10C is a cross-sectional view taken along line B3-B4 in FIG. 10A.

As illustrated in FIGS. 10A to 10C, an OS transistor 652 includes the base insulating film 602 over the substrate 600, the multilayer film 606 over the base insulating film 602, the source electrode 616a, the drain electrode 616b, the gate insulating film 612, the gate electrode 604, and the protective insulating film 618.

The oxide layer 606a and the oxide semiconductor layer 606b are stacked over the base insulating film 602. The source electrode 616a and the drain electrode 616b are provided over and in contact with the stacked film of the oxide layer 606a and the oxide semiconductor layer 606b. The oxide layer 606c is provided over the stacked film, the source electrode 616a, and the drain electrode 616b. The gate electrode 604 is provided over the oxide layer 606c with the gate insulating film 612 provided therebetween.

Although FIG. 10A shows an example where the gate electrode 604, the gate insulating film 612, and the oxide layer 606c have substantially the same layout shape (when seen from above), one embodiment of the present invention is not limited thereto. For example, the oxide layer 606c and/or the gate insulating film 612 may be provided to extend to the outside of the gate electrode 604.

Depending on a kind of the conductive film used for the source electrode 616a and the drain electrode 616b, oxygen is removed from part of the oxide semiconductor layer 606b or a mixed layer is formed so that n-type regions are formed in the oxide semiconductor layer 606b in some cases. In FIG. 10B, the boundaries of the n-type regions are denoted by dotted lines.

In a plane layout illustrated in FIG. 10A, the gate electrode 604 is provided to overlap with the whole channel formation region. With such a layout, generation of carriers in the channel formation region due to light can be prevented when light is emitted from the gate electrode 604 side. In other words, the gate electrode 604 functions as a light-blocking film in the example in FIG. 10A. It is needless to say that the channel formation region may be formed in a region which does not overlap with the gate electrode 604.

<Example of Manufacturing Method 2 of OS Transistor>

An example of a method for manufacturing the OS transistor 652 is described below with reference to FIGS. 11A to 11D and FIGS. 12A to 12D. Steps for manufacturing the OS transistor 652 are performed in a manner similar to those for manufacturing the OS transistor 651.

First, the substrate 600 is prepared. Next, the base insulating film 602 is formed. Next, the oxide layer 636a and the oxide semiconductor layer 636b are formed in this order (see FIG. 11A).

Figure 11A:
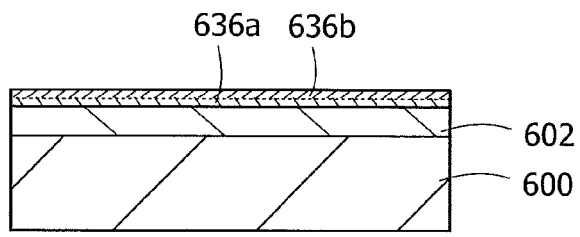
FIGS. 11A to 11D are cross-sectional views illustrating an example of a method for manufacturing the transistor in FIG. 10A.
Figure 11B:
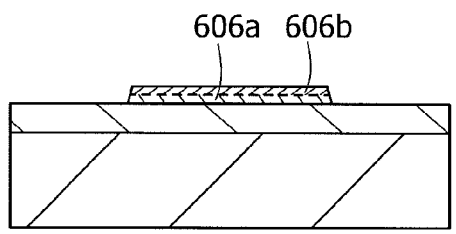

Then, the oxide layer 636a and the oxide semiconductor layer 636b are partly etched to form the oxide layer 606a and the oxide semiconductor layer 606b that have an island shape (see FIG. 11B). It is preferable that the first heat treatment be performed before this etching.

Figure 11C:
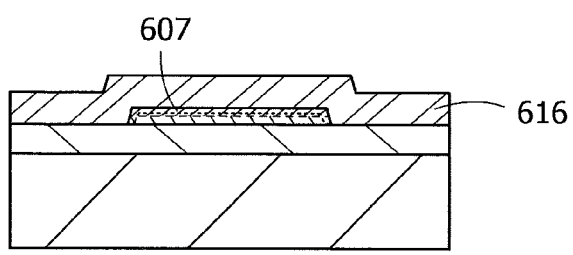

Next, the conductive film 616 is formed (see FIG. 11C). With formation of the conductive film 616, the n-type region 607 is formed over the stacked film of the oxide layer 606a and the oxide semiconductor layer 606b in some cases.

Figure 11D:
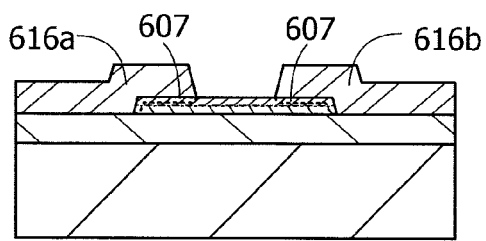

Next, the conductive film 616 is partly etched, so that the source electrode 616a and the drain electrode 616b are formed (see FIG. 11D). Next, second heat treatment is preferably performed. The second heat treatment changes an exposed part of the n-type region 607 in the oxide semiconductor layer 606b into an i-type region in some cases (see FIG. 11D).

Figure 12A:
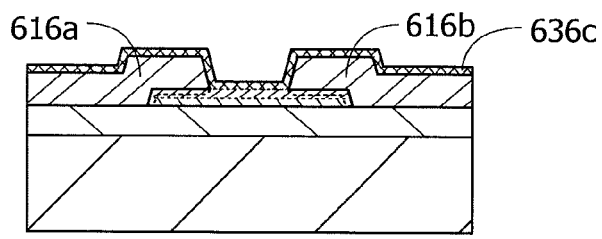
FIGS. 12A to 12D are cross-sectional views illustrating the example of the method for manufacturing the transistor in FIG. 10A.

Then, an oxide layer 636c is formed (see FIG. 12A).

Next, an insulating film 642 is formed. The insulating film 642 can be formed by a plasma CVD method, for example. By the CVD method, a denser insulating film having a lower defect density can be provided as a substrate temperature is higher. Because the insulating film 642 after being processed serves as the gate insulating film 612, a transistor can have more stable electrical characteristics, as the insulating film 642 is denser and has a lower defect density. On the other hand, when the base insulating film 602 contains excess oxygen, a transistor can have stable electrical characteristics. However, by raising the substrate temperature when the base insulating film 602 is exposed, oxygen is released from the base insulating film 602, so that excess oxygen is reduced. Here, because the base insulating film 602 is covered with the oxide layer 636c at the time of formation of the insulating film 642, oxygen can be prevented from being released from the base insulating film 602. Therefore, the insulating film 642 can be dense and have a low defect density, without reducing excess oxygen contained in the base insulating film 602. For this reason, the reliability of the transistor can be improved.

Figure 12B:
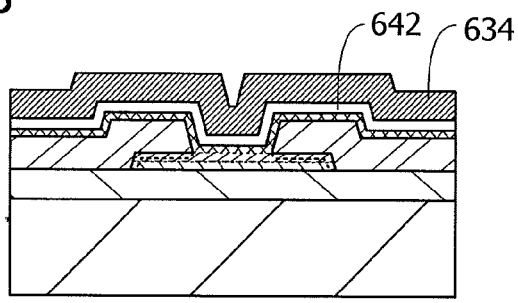
Figure 12C:
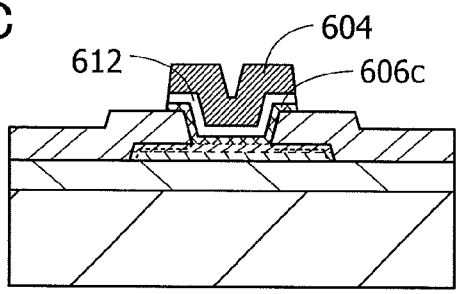
Figure 12D:
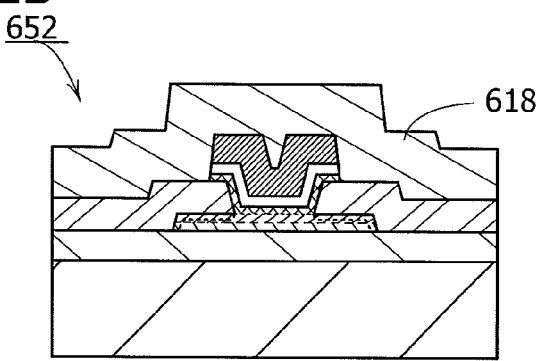

Next, a conductive film 634 is formed (see FIG. 12B). Then, the oxide layer 636c, the insulating film 642, and the conductive film 634 are partly etched to form the oxide layer 606c, the gate insulating film 612, and the gate electrode 604 (see FIG. 12C).

Next, the protective insulating film 618 is formed. Through the above steps, the OS transistor 652 illustrated in FIG. 10C can be manufactured (see FIG. 12D). After the protective insulating film 618 is formed, third heat treatment is preferably performed. The third heat treatment can be performed under a condition similar to that of the first heat treatment.

This embodiment can be implemented in appropriate combination with any of the other embodiments.

Embodiment 4

The shift register disclosed in this specification can be used for integrated circuits of electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, ICs for controlling and/or protecting batteries (second batteries), and radio telescopes in radio astronomy.

Examples of such electronic devices are display devices, personal computers, and image reproducing devices provided with recording media (devices that read image data of recording media such as digital versatile discs (DVDs) and have displays for displaying images). Other examples are cellular phones, game machines including portable game machines, portable information terminals, e-book readers, cameras (e.g., video cameras and digital still cameras), goggle-type displays (head mounted displays), navigation systems, audio reproducing devices (e.g., car audio systems and digital audio players), copiers, facsimiles, printers, and multifunction printers. FIGS. 13A to 13F illustrate specific examples of these electronic devices.

Figure 13A:
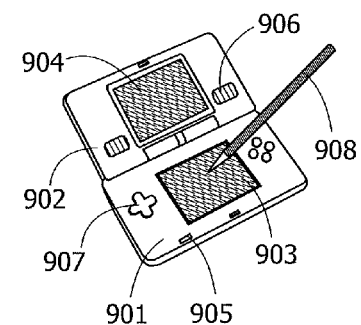
FIGS. 13A to 13F are external views illustrating examples of electronic devices.

FIG. 13A is an external view illustrating a structure example of a portable game machine. The portable game machine includes a housing 901, a housing 902, a display portion 903, a display portion 904, a microphone 905, a speaker 906, an operation key 907, a stylus 908, and the like.

Figure 13B:
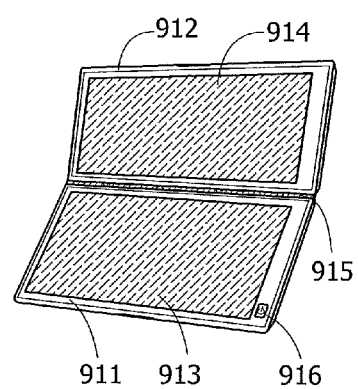

FIG. 13B is an external view illustrating a structure example of a portable information terminal. The portable information terminal includes a housing 911, a housing 912, a display portion 913, a display portion 914, a joint 915, an operation key 916, and the like. The display portion 913 is provided in the housing 911, and the display portion 914 is provided in the housing 912. The housing 911 and the housing 912 are connected to each other with the joint 915, and an angle between the housing 911 and the housing 912 can be changed with the joint 915. An image on the display portion 913 may be switched depending on the angle between the housing 911 and the housing 912 at the joint 915. A display device with a position input function may be used as at least one of the display portion 913 and the display portion 914. Note that the position input function can be added by providing a touch panel in a display device. Alternatively, the position input function can be added by providing a photoelectric conversion element called a photosensor in a pixel portion of a display device.

Figure 13C:
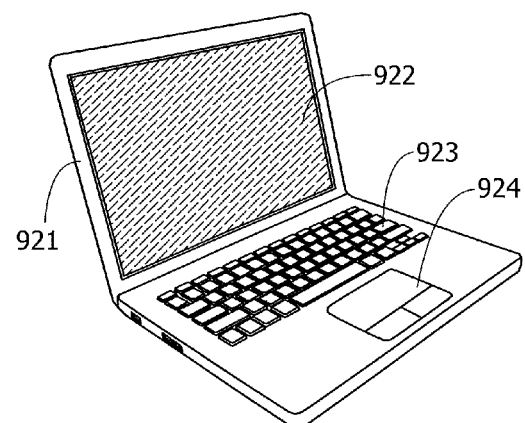

FIG. 13C is an external view illustrating a structure example of a laptop. The laptop includes a housing 921, a display portion 922, a keyboard 923, a pointing device 924, and the like.

Figure 13D:
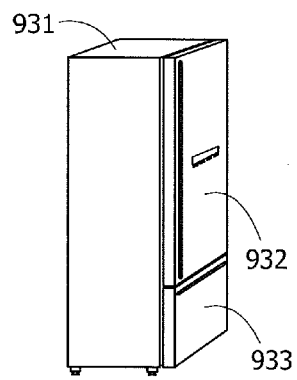

FIG. 13D is an external view illustrating a structure example of an electric refrigerator-freezer. The electric refrigerator-freezer includes a housing 931, a refrigerator door 932, a freezer door 933, and the like.

Figure 13E:
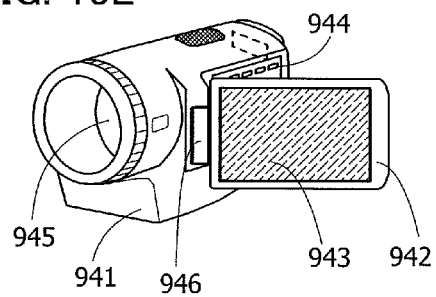

FIG. 13E is an external view illustrating a structure example of a video camera. The video camera includes a housing 941, a housing 942, a display portion 943, operation keys 944, a lens 945, a joint 946, and the like. The operation keys 944 and the lens 945 are provided in the housing 941, and the display portion 943 is provided in the housing 942. The housing 941 and the housing 942 are connected to each other with the joint 946, and an angle between the housing 941 and the housing 942 can be changed with the joint 946. The direction of an image on the display portion 943 may be changed and display and non-display of an image may be switched depending on the angle between the housing 941 and the housing 942.

Figure 13F:
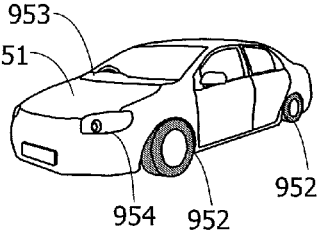

FIG. 13F is an external view illustrating a structure example of a motor vehicle. The motor vehicle includes a car body 951, wheels 952, a dashboard 953, lights 954, and the like.

This embodiment can be implemented in appropriate combination with any of the other embodiments.

This application is based on Japanese Patent Application serial no. 2013-024732 filed with Japan Patent Office on Feb. 12, 2013, the entire contents of which are hereby incorporated by reference.

What is claimed is:
1. A semiconductor device comprising:
   a shift register comprising a plurality of stages, each of the plurality of stages comprising a flipflop,
   wherein in each of the plurality of stages, the flipflop comprises a first memory circuit, a second memory circuit and a third memory circuit,
   wherein in each of the plurality of stages, the second memory circuit is configured to save data of the first memory circuit, write data of the first memory circuit to the third memory circuit and write data of the third memory circuit to the first memory circuit, wherein the third memory circuit of each of stages other than a last stage among the plurality of stages is configured to transfer the data to the third memory circuit of a next stage, and wherein in each of the plurality of stages, each of the second memory circuit and the third memory circuit is configured to hold data in a period during which power supply to the flipflop is stopped.

2. The semiconductor device according to claim 1, further comprising a plurality of combination circuits, wherein in each of the plurality of stages, the first memory circuit is configured to store data output from a corresponding combination circuit among the plurality of combination circuits.

3. A semiconductor device comprising:

a shift register comprising a first stage and a second stage, each of the first stage and the second stage comprising a flipflop, wherein in each of the first stage and the second stage, the flipflop comprises a first memory circuit, a second memory circuit and a third memory circuit, wherein in each of the first stage and the second stage, the first memory circuit comprises a first data holding portion, a first input terminal and a first output terminal, wherein in each of the first stage and the second stage, the first memory circuit is configured to store data input from the first input terminal to the first data holding portion and output the data stored in the first data holding portion from the first output terminal, wherein in each of the first stage and the second stage, the third memory circuit comprises a second data holding portion, a second input terminal and a second output terminal, wherein the second output terminal of the third memory circuit of the first stage is electrically connected to the second input terminal of the third memory circuit of the second stage, wherein in each of the first stage and the second stage, the third memory circuit is configured to store data input from the second input terminal to the second data holding portion and output the data stored in the second data holding portion from the second output terminal, wherein in each of the first stage and the second stage, the second memory circuit is configured to store the data stored in the first data holding portion to the second data holding portion and store the data stored in the second data holding portion to the first data holding portion, and wherein in each of the first stage and the second stage, each of the second memory circuit and the third memory circuit is configured to hold the data in the second data holding portion in a period during which power supply to the flipflop is stopped.

4. The semiconductor device according to claim 3, further comprising a first combination circuit and a second combination circuit, wherein the first memory circuit of the first stage is configured to store data output from the first combination circuit, and wherein the second memory circuit of the second stage is configured to store data output from the second combination circuit.

5. The semiconductor device comprising according to claim 3, wherein in each of the first stage and the second stage, the first data holding portion comprises a first node and a second node, wherein in each of the first stage and the second stage, the third memory circuit comprises a third node, a fourth node, a switch, a first reading circuit and a second reading circuit, wherein in each of the first stage and the second stage, the switch is configured to control conduction or non-conduction between the second input terminal and the third node in accordance with a first signal, wherein in each of the first stage and the second stage, the first reading circuit is configured to read a potential of the third node and output a first potential depending on the potential of the third node to the fourth node in accordance with a second signal, wherein in each of the first stage and the second stage, the second reading circuit is configured to read a potential of the fourth node and output the first potential depending on the potential of the fourth node to the second output terminal in accordance with the potential of the fourth node, wherein in each of the first stage and the second stage, the second memory circuit comprises a third reading circuit, a fourth reading circuit, a fifth reading circuit and a sixth reading circuit, wherein in each of the first stage and the second stage, the third reading circuit is configured to read a potential of the first node and output the first potential depending on the potential of the first node to the third node in accordance with a third signal, wherein in each of the first stage and the second stage, the fourth reading circuit is configured to read a potential of the second node and output the first potential depending on the potential of the second node to the fourth node in accordance with the third signal, wherein in each of the first stage and the second stage, the fifth reading circuit is configured to read the potential of the third node and output the first potential depending on the potential of the third node to the first node in accordance with a fourth signal, and wherein in each of the first stage and the second stage, the sixth reading circuit is configured to read the potential of the fourth node and output the first potential depending on the potential of the fourth node to the second node in accordance with the fourth signal.

6. The semiconductor device according to claim 5, wherein in each of the first stage and the second stage, the switch comprises a first transistor, wherein in each of the first stage and the second stage, the first signal is input to a gate of the first transistor, wherein in each of the first stage and the second stage, one of a source and a drain of the first transistor is connected to the second input terminal, wherein in each of the first stage and the second stage, the other of the source and the drain of the first transistor is connected to the third node, wherein in each of the first stage and the second stage, the first reading circuit comprises a second transistor and a third transistor connected in series between a first wiring to which the first potential is supplied and the fourth node, wherein in each of the first stage and the second stage, a gate of the second transistor is connected to the third node, wherein in each of the first stage and the second stage, the second signal is input to a gate of the third transistor, wherein in each of the first stage and the second stage, the second reading circuit comprises a fourth transistor, wherein in each of the first stage and the second stage, a gate of the fourth transistor is connected to the fourth node, wherein in each of the first stage and the second stage, one of a source and a drain of the fourth transistor is connected to a second wiring to which the first potential is supplied, and wherein in each of the first stage and the second stage, the other of the source and the drain of the fourth transistor is connected to the second output terminal.

7. The semiconductor device according to claim 6, wherein in each of the first stage and the second stage, each of the first transistor, the second transistor, the third transistor and the fourth transistor comprises a channel formation region in an oxide semiconductor layer.

8. The semiconductor device according to claims 5, wherein in each of the first stage and the second stage, the third reading circuit comprises a fifth transistor and a sixth transistor connected in series, wherein in each of the first stage and the second stage, a gate of the fifth transistor is connected to the first node, wherein in each of the first stage and the second stage, one of a source and a drain of the fifth transistor is connected to a third wiring to which the first potential is supplied, wherein in each of the first stage and the second stage, the third signal is input to a gate of the sixth transistor, wherein in each of the first stage and the second stage, one of a source and a drain of the sixth transistor is connected to the third node, wherein in each of the first stage and the second stage, the fourth reading circuit comprises a seventh transistor and an eighth transistor connected in series, wherein in each of the first stage and the second stage, a gate of the seventh transistor is connected to the second node, wherein in each of the first stage and the second stage, one of a source and a drain of the seventh transistor is connected to a fourth wiring to which the first potential is supplied, wherein in each of the first stage and the second stage, the third signal is input to a gate of the eighth transistor, and wherein in each of the first stage and the second stage, one of a source and a drain of the eighth transistor is connected to the fourth node.

9. The semiconductor device according to claim 8, wherein in each of the first stage and the second stage, at least one of the fifth transistor, the sixth transistor, the seventh transistor and the eighth transistor comprises a channel in an oxide semiconductor layer.

10. The semiconductor device according to claim 5, wherein in each of the first stage and the second stage, the fifth reading circuit comprises a ninth transistor and a tenth transistor connected in series, wherein in each of the first stage and the second stage, a gate of the ninth transistor is connected to the third node, wherein in each of the first stage and the second stage, one of a source and a drain of the ninth transistor is connected to a fifth wiring to which the first potential is supplied, wherein in each of the first stage and the second stage, the fourth signal is input to a gate of the tenth transistor, wherein in each of the first stage and the second stage, one of a source and a drain of the tenth transistor is connected to the first node, wherein in each of the first stage and the second stage, the sixth reading circuit comprises an eleventh transistor and a twelfth transistor connected in series, wherein in each of the first stage and the second stage, a gate of the eleventh transistor is connected to the fourth node, wherein in each of the first stage and the second stage, one of a source and a drain of the eleventh transistor is connected to the fifth wiring to which the first potential is supplied, wherein in each of the first stage and the second stage, the fourth signal is input to a gate of the twelfth transistor, and wherein in each of the first stage and the second stage, one of a source and a drain of the twelfth transistor is connected to the second node.

11. The semiconductor device according to claim 5, further comprising a thirteenth transistor and a fourteenth transistor, wherein in each of the first stage and the second stage, one of a source and a drain of the thirteenth transistor is connected to the third node, wherein in each of the first stage and the second stage, the other of the source and the drain of the thirteenth transistor is connected to a sixth wiring to which a second potential is supplied, wherein in each of the first stage and the second stage, one of a source and a drain of the fourteenth transistor is connected to the fourth node, and wherein in each of the first stage and the second stage, the other of the source and the drain of the fourteenth transistor is connected to a seventh wiring to which the second potential is supplied.

12. A semiconductor device comprising:
a shift register comprising a first stage and a second stage, each of the first stage and the second stage comprising:
a first data holding portion comprising:
a first node; and
a second node;
a second data holding portion comprising:
a third node; and
a fourth node;
a first transistor;
a second transistor;
a third transistor;
a fourth transistor;
a fifth transistor; and
a sixth transistor,
wherein in each of the first stage and the second stage, a gate of the first transistor is connected to the first node,
wherein in each of the first stage and the second stage, a gate of the second transistor is connected to the second node,
wherein in each of the first stage and the second stage, one of a source and a drain of the first transistor is connected to the third node,
wherein in each of the first stage and the second stage, one of a source and a drain of the second transistor is connected to the fourth node,
wherein in each of the first stage and the second stage, one of a source and a drain of the third transistor is connected to the first node,
wherein in each of the first stage and the second stage, one of a source and a drain of the fourth transistor is connected to the second node,
wherein in each of the first stage and the second stage, a gate of the third transistor is connected to the third node,
wherein in each of the first stage and the second stage, a gate of the fourth transistor is connected to the fourth node, wherein in each of the first stage and the second stage, a gate of the fifth transistor is connected to the third node, wherein in each of the first stage and the second stage, one of a source and a drain of the fifth transistor is connected to the fourth node, wherein in each of the first stage and the second stage, a gate of the sixth transistor is connected to the fourth node, and wherein one of a source and a drain of the sixth transistor of the first stage is connected to the third node of the second stage.

13. The semiconductor device according to claim 12, further comprising a first combination circuit and a second combination circuit, wherein the first data holding portion of the first stage is configured to store data output from the first combination circuit, and wherein the first data holding portion of the second stage is configured to store data output from the second combination circuit.

14. The semiconductor device according to claim 12, further comprising a seventh transistor, an eighth transistor, a ninth transistor, a tenth transistor, an eleventh transistor and a twelfth transistor, wherein in each of the first stage and the second stage, the one of the source and the drain of the first transistor is connected to the third node via the seventh transistor, wherein in each of the first stage and the second stage, the one of the source and the drain of the second transistor is connected to the fourth node via the eighth transistor, wherein in each of the first stage and the second stage, the one of the source and the drain of the third transistor is connected to the first node via the ninth transistor, wherein in each of the first stage and the second stage, the one of the source and the drain of the fourth transistor is connected to the second node via the tenth transistor, wherein in each of the first stage and the second stage, one of a source and a drain of the eleventh transistor is connected to the third node, wherein in each of the first stage and the second stage, the one of the source and the drain of the fifth transistor is connected to the fourth node via the twelfth transistor, and wherein the one of the source and the drain of the sixth transistor of the first stage is connected to the third node of the second stage via the eleventh transistor of the second stage.

15. The semiconductor device according to claim 14, wherein in each of the first stage and the second stage, each of the fifth transistor, the sixth transistor, the eleventh transistor and the twelfth transistor comprises a channel formation region in an oxide semiconductor layer.

16. The semiconductor device according to claim 14, wherein in each of the first stage and the second stage, at least one of the first transistor, the second transistor, the seventh transistor and the eighth transistor comprises a channel in an oxide semiconductor layer.

17. The semiconductor device according to claim 14, further comprising a thirteenth transistor and a fourteenth transistor, wherein in each of the first stage and the second stage, one of a source and a drain of the thirteenth transistor is connected to the third node, and wherein in each of the first stage and the second stage, one of a source and a drain of the fourteenth transistor is connected to the fourth node.

* * * * *